(12) United States Patent
Cho

(10) Patent No.: US 7,408,496 B2
(45) Date of Patent: Aug. 5, 2008

(54) METHOD, APPARATUS AND SYSTEM SHARING AN OPERATIONAL AMPLIFIER BETWEEN TWO STAGES OF PIPELINED ADC AND/OR TWO CHANNELS OF SIGNAL PROCESSING CIRCUITRY

(75) Inventor: Taehee Cho, Irvine, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/506,874

(22) Filed: Aug. 21, 2006

(65) Prior Publication Data

US 2008/0042890 A1 Feb. 21, 2008

(51) Int. Cl.
  *H03M 1/38* (2006.01)
(52) U.S. Cl. ................................ 341/161; 341/162
(58) Field of Classification Search ................. 341/161, 341/162, 163; 348/308
  See application file for complete search history.

(56) References Cited

U.S. PATENT DOCUMENTS

| | | | |
|---|---|---|---|
| 5,764,176 | A | 6/1998 | Ginetti |
| 6,133,864 | A | 10/2000 | Sabatini |
| 6,437,608 | B1 | 8/2002 | Miyabe et al. |
| 6,469,652 | B1 | 10/2002 | Aude |
| 6,870,495 | B1 * | 3/2005 | Zadeh et al. ............... 341/161 |
| 6,946,987 | B1 | 9/2005 | Van Blerkom et al. |
| 6,954,169 | B1 | 10/2005 | Min |
| 6,956,519 | B1 | 10/2005 | Huang et al. |
| 6,965,258 | B2 | 11/2005 | Bogner |
| 7,106,240 | B2 | 9/2006 | Cringean |
| 2005/0140537 | A1 | 6/2005 | Waltari |
| 2006/0044172 | A1 * | 3/2006 | Sasaki et al. ............... 341/161 |
| 2006/0125674 | A1 | 6/2006 | Tadeparthy et al. |
| 2006/0187329 | A1 * | 8/2006 | Panicacci ................... 348/308 |

OTHER PUBLICATIONS

Ray et al. A low power 10 bit 80 MSPS pipelined ADC in digital CMOS process, IEEE, 2002 Midwest Symposium on Circuits and Systems, Aug. 2002, pp. 579-582.*
K. Nagaraj, et al., "A 250-mW, 8-b, 52-Msamples/s Parallel-Pipelined A/D Converter with Reduced Number of Amplifiers," IEEE Journal of Solid-State Circuits, vol. 32, No. 3, Mar. 1997.
B. Min, et al., "A 69-mW 10-bit 80-MSample/s Pipelined CMOS ADC," IEEE Journal of Solid-State Circuits, vol. 38, No. 12, Dec. 2003.

* cited by examiner

*Primary Examiner*—Howard Williams
(74) *Attorney, Agent, or Firm*—Dickstein Shapiro LLP

(57) ABSTRACT

A mechanism for discharging parasitic capacitance at an input of an operational amplifier, which is shared between two stages of a pipelined analog-to-digital converter and/or two channels of signal processing circuitry. The operational amplifier contains two input circuits that are time multiplexed in a manner that allows capacitance to be discharged at one input circuit while the other input circuit is inputting signals into the amplifier. The discharging of the parasitic capacitance substantially mitigates the memory effect and the problems associated with the memory effect.

26 Claims, 24 Drawing Sheets

METHOD, APPARATUS AND SYSTEM SHARING AN OPERATIONAL AMPLIFIER BETWEEN TWO STAGES OF PIPELINED ADC AND/OR TWO CHANNELS OF SIGNAL PROCESSING CIRCUITRY

FIELD OF THE INVENTION

Embodiments of the invention relate to pipelined analog-to-digital converters that share operational amplifiers between stages of the pipeline and signal processing circuitry that shares an operational amplifier between two signal processing channels.

BACKGROUND OF THE INVENTION

Analog-to-digital converters (ADCs) are useful components in any circuit or system that interfaces analog and digital circuitry and signals. One application in which analog-to-digital converters are particularly useful includes imaging devices such as CMOS and CCD imagers. Imagers typically convert light photons into analog image signals. These analog image signals are converted to digital signals, by an analog-to-digital converter, and then processed by an image processor or other processing circuitry.

There is a desire to increase the speed of the analog-to-digital conversion process in many applications such as e.g., imagers. As such, many applications use pipelined analog-to-digital converters, which typically operate faster than non-pipelined analog-to-digital converters. FIG. 1 is an illustration of a conventional N-bit pipelined analog-to-digital converter 10. The pipelined analog-to-digital converter 10 consists of multiple low resolution (e.g., 1.5 bits) stages $12_1$, $12_2$, ..., $12_n$, $12_{N-1}$, each of which comprises an arithmetic unit 20 and a two-level decision circuit 40. The pipelined analog-to-digital converter 10 further includes digital correction logic 14 for outputting an N-bit digital code representing an input analog signal.

FIG. 1 illustrates the components of the nth stage $12_n$ in more detail. It should be appreciated that the other stages $12_1$, $12_2$, ..., $12_{N-1}$ contain the same circuitry as the nth stage $12_n$. The arithmetic unit 20 comprises a switching block 22, four additional switches 24, 26, 28, 30, a sampling capacitor Cs, a feedback capacitor Cf, and an operational amplifier 32. The decision circuit 40 includes two comparators 42, 44 and an encoder 46.

In operation, the arithmetic unit 20 in the first stage $12_1$ merely operates as a sample and hold circuit. In the other stages $12_2$, ..., $12_n$, $12_{N-1}$, the arithmetic unit 20 multiplies the incoming analog signal portion $V_{RES(n-1)}$, often referred to as a "residue," by a factor of two and subtracts from this product one of three voltages $+V_R$, 0, $-V_R$, based on the closed switch in the switching block 22. The switches of block 22 are opened/closed based on the decision bits $D_{n-1}$ from a prior stage (e.g., stage $12_{n-1}$). The new residue is fed into the decision circuit 40, where it is compared with two different reference voltages $\frac{1}{4}VR$, $-\frac{1}{4}V_R$. The encoder generates and outputs decision bits $D_n$ for the stage $12_n$. The decision bits for each of the stages $12_1, 12_2, \ldots, 12_n, \ldots 12_{N-1}$ are processed by the digital correction logic 14, which removes any redundancy and outputs the N-bit digital output code.

As can be seen in FIG. 1, the conventional pipelined analog-to-digital converter 10 requires one operational amplifier 32 for each stage $12_1, 12_2, \ldots, 12_n, \ldots 12_{N-1}$ in the pipeline. The majority of the power of the pipelined analog-to-digital converter 10 is consumed by operational amplifiers 32. Therefore, minimizing the power consumption of the operational amplifiers 32 is key to the design of low power pipelined analog-to-digital converters 10.

FIG. 2 illustrates the timing diagram for two stages STAGE 1, STAGE 2 of the FIG. 1 pipelined analog-to-digital converter 10. Non-overlapping clock signals PHI1, PHI2 are used to control the switching circuitry contained within each stage STAGE 1, STAGE 2 to configure how the sampling and feedback capacitors Cs, Cf and the operational amplifier 32 are connected.

FIG. 3 illustrates the operational amplifier configuration of the two stages STAGE 1, STAGE 2 when the second clock signal PHI2 is asserted (i.e., has a high level). As can be seen in FIGS. 2 and 3, the first stage STAGE 1 undergoes a sampling operation while the second stage STAGE 2 undergoes an amplifying operation. That is, the first stage's arithmetic unit $20_1$ is configured such the analog input voltage Vin is sampled in the sampling capacitor Cs. The second stage's arithmetic unit $20_2$ is configured in a manner such that the operational amplifier 32 amplifies the signal stored in the sampling capacitor Cs and outputs the amplified signal as Vout.

FIG. 4 illustrates the operational amplifier configuration of the two stages STAGE 1, STAGE 2 when the first clock signal PHI1 is asserted (i.e., has a high level). As can be seen in FIGS. 2 and 4, the first stage STAGE 1 undergoes the amplifying operation while the second stage STAGE 2 undergoes the sampling operation. That is, the first stage's arithmetic unit $20_1$ is configured such the signal stored in the sampling capacitor Cs is amplified by the operational amplifier 32. The second stage's arithmetic unit $20_2$ is configured to sample the output from the first stage STAGE 1 and store it in the stage 2 STAGE 2 sampling capacitor Cs.

It can be seen from FIGS. 3 and 4 that during the sampling operations, the operational amplifiers 32 performs no useful function; they just consume power. This occurs because the operational amplifiers 32 are placed into an open-loop configuration with their inputs and outputs connected to known voltage levels. To avoid wasting power during every sampling operation, some analog-to-digital converters share one operational amplifier 32 between two adjacent stages STAGE 1, STAGE 2 as is shown in FIGS. 5 and 6.

FIGS. 5 and 6 illustrate a circuit 120 of a pipelined analog-to-digital converter in which arithmetic units $20_1$, $20_2$ of two pipeline stages STAGE 1, STAGE 2 share one operational amplifier 32. The amplifier 32 can be shared because the circuit 120 contains six switches S1, S2, S3, S4, S5, S6 that are controlled to connect the sampling and feedback capacitors Cs, Cf to the operational amplifier 32 inputs and outputs differently depending on the operation being performed.

FIG. 5 illustrates the circuit 120 when the second clock signal PHI2 of FIG. 2 is asserted. While the second clock signal PHI2 is asserted, switch S1 is closed to connect the analog input voltage Vin to the stage 1 arithmetic unit $20_1$ sampling capacitor Cs. Switches S5 and S6 are closed in the second stage's arithmetic unit $20_2$ such that the operational amplifier 32 amplifies, and outputs as Vout, a signal stored in the stage 2 arithmetic unit $20_2$ sampling capacitor Cs. The other switches S2, S3 and S4 are left open. Thus, as can be seen in FIGS. 2 and 5, the first stage STAGE 1 undergoes a sampling operation while the second stage STAGE 2 undergoes an amplifying operation, but only one operational amplifier 32 is connected and used.

FIG. 6 illustrates the circuit 120 when the first clock signal PHI1 of FIG. 2 is asserted. While the first clock signal PHI1 is asserted, switches S1, S5 and S6 are open, and switches S2, S3 and S4 are closed. As such, the first stage's arithmetic unit $20_1$ is configured such that a signal stored in the first stage arithmetic unit $20_1$ sampling capacitor Cs is amplified by the operational amplifier 32 and output as Vout. The second stage's arithmetic unit $20_2$ is configured to sample and store an analog input Vin in the stage 2 STAGE 2 sampling capacitor Cs. As can be seen in FIGS. 2 and 6, the first stage STAGE 1 undergoes the amplifying operation while the second stage STAGE 2 undergoes the sampling operation. Again, only one operational amplifier 32 is connected and used during these operations.

By sharing an operational amplifier 32 between two adjacent stages STAGE 1, STAGE 2, the power consumption of the pipelined analog-to-digital converter 10 (FIG. 1) can be reduced by half. However due to the finite DC gain $A_O$ and input parasitic capacitance Cp of the operational amplifier 32 (FIG. 7b), the previous output $V_O(k-1)$ adversely effects the present output $V_O(k)$, which is known in the art as the "memory effect." The memory effect can cause a non-linearity in the operational amplifier 32 and thus, analog-to-digital converter output.

Briefly, the memory effect can be described using the following equations in reference to FIG. 7a. Ideally, during sampling, charge should be represented as Q=(Cf+Cs)×Vin. From charge conversion, at the amplifying phase, Q=Cf×$(V_O-V_X)$−Cp×$V_X$−Cs×$V_X$=(Cf+Cs)×Vin, where $V_X$ is the input node voltage of the operational amplifier 32. Because the amplifier has a finite gain $A_O$, $V_O$=−$A_O$×$V_X$, which yields $V_X$=−$V_O/A_O$. This means that Cf×($V_O$+$V_O/A_O$)+Cp×$V_O$/$A_O$+Cs×$V_O$/$A_O$=(Cf+Cs)×Vin. Therefore, $V_O$=Vin×(Cf+Cs)/(Cf+(Cf+Cs+Cp)/$A_O$), which equals Vin×Gc.

In reality, however, there is charge associated with parasitic capacitance Cp (due to the memory effect). As such, at the sampling stage, as shown in FIG. 7b, Q=(Cf+Cs)×Vin(k)−Cp×Vin_err(k), where Vin_err(k) is the memory error associated with the parasitic capacitance Cp. Using just the error term, from charge conversion, $V_O$(k)=−Vin_err(k)×Cp/(Cf+(Cf+Cs+Cp)/$A_O$)~=−Vin_err(k)×Cp/Cf, if $A_O$ is large enough. For the first and second terms $V_O$(k)=Vin(k)×Gc−Vin_err(k)×Cp/(Cf+(Cf+Cs+Cp)/$A_O$). Since Vin_err(k) comes from the previous output, Vin_err(k)=−$V_O$(k−1)/$A_O$=−Gc×Vin(k−1)/$A_O$. Accordingly, $V_O$(k)=Vin(k)×Gc+Vin(k−1)×Gc/$A_O$×Cp/(Cf+(Cf+Cs+Cp)/$A_O$)=Vin(k)×Gc+Vin(k−1)×Gc×e, where e=1/$A_O$×Cp/(Cf+(Cf+Cs+Cp)/$A_O$)~1/$A_O$×Cp/Cf. It should be noted that the second order errors are neglected in the above calculations.

In addition, charge injection and kickback noise from the circuitry add to the memory effect error described above. Reducing the memory effect is a key element in designing a pipelined analog-to-digital converter that shares operational amplifiers between two pipeline stages.

Accordingly, there is a need and desire for a pipelined analog-to-digital converter that shares an operational amplifier between two pipeline stages, yet does not suffer from the memory effect and the problems associated with the memory effect.

It is known to divide signal processing circuitry into multiple channels. For example, imagers often include multiple readout channels where one channel processes a specific set of pixel signals and at least one other channel processes the remaining sets of pixel signals. FIG. 7c illustrates a two channel processing circuit 150 designed to sample and hold analog input signals and convert the signals into digital signals. As shown in FIG. 7c, the first channel CHANNEL 1 comprises a sample and hold circuit $152_a$ and multiple analog-to-digital pipeline stages $154_a$, $156_a$. Similarly, the second channel CHANNEL 2 comprises a sample and hold circuit $152_b$ and multiple analog-to-digital pipeline stages $154_b$, $156_b$. The sample and hold circuits $152_a$, $152_b$ share an operational amplifier 32. The analog-to-digital pipeline stages $154_a$, $154_b$ share an operational amplifier 32 as do the other analog-to-digital pipeline stages $156_a$, $156_b$.

The devices of the two channels CHANNEL 1, CHANNEL 2 share the operational amplifiers in a similar manner and with similar timing (e.g., FIG. 2) as the adjacent pipelined analog-to-digital converter stages share the operational amplifiers (as discussed above). That is, the channels switch in or out the amplifier based on the operation being performed in that portion of the channel. Thus, although the circuit 150 achieves the benefits of reducing the number of operational amplifiers, the circuit 150 also suffers from the memory effect.

Accordingly, there is a need and desire for sharing an operational amplifier between two channels of a signal processing circuit, yet does not suffer from the memory effect and the problems associated with the memory effect.

DETAILED DESCRIPTION OF THE INVENTION

Embodiments described herein provide a pipelined analog-to-digital converter that shares an operational amplifier between two pipeline stages, yet does not suffer from the problems of prior art circuits. The embodiments also provide for the sharing of an operational amplifier between two channels of a signal processing circuit, yet does not suffer from the problems of prior art circuits.

Figure 8A:
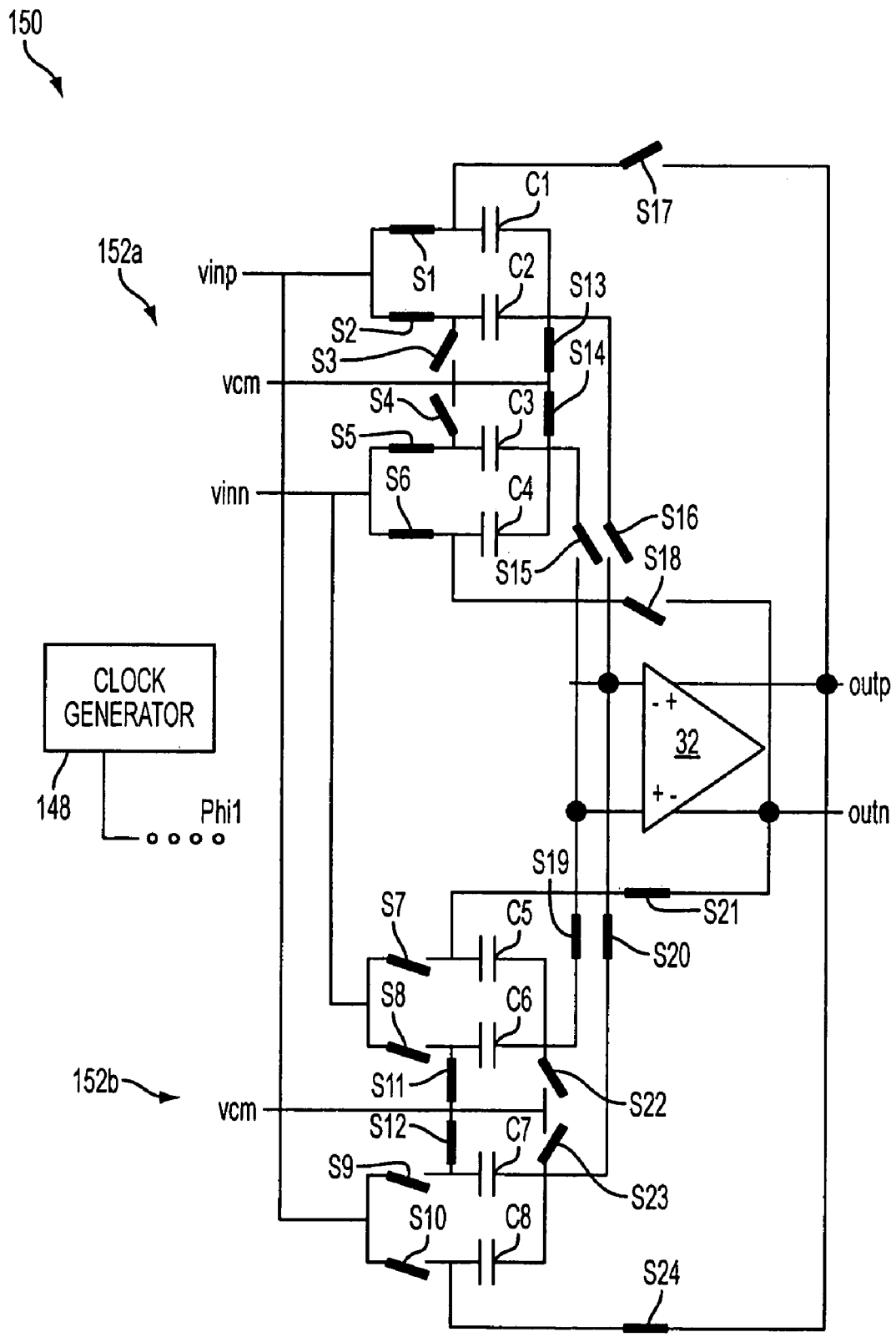
FIGS. 8a and 8b illustrate a portion of a conventional two-channel signal processing circuit that shares operational amplifiers between respective portions of the channels.
Figure 8B:
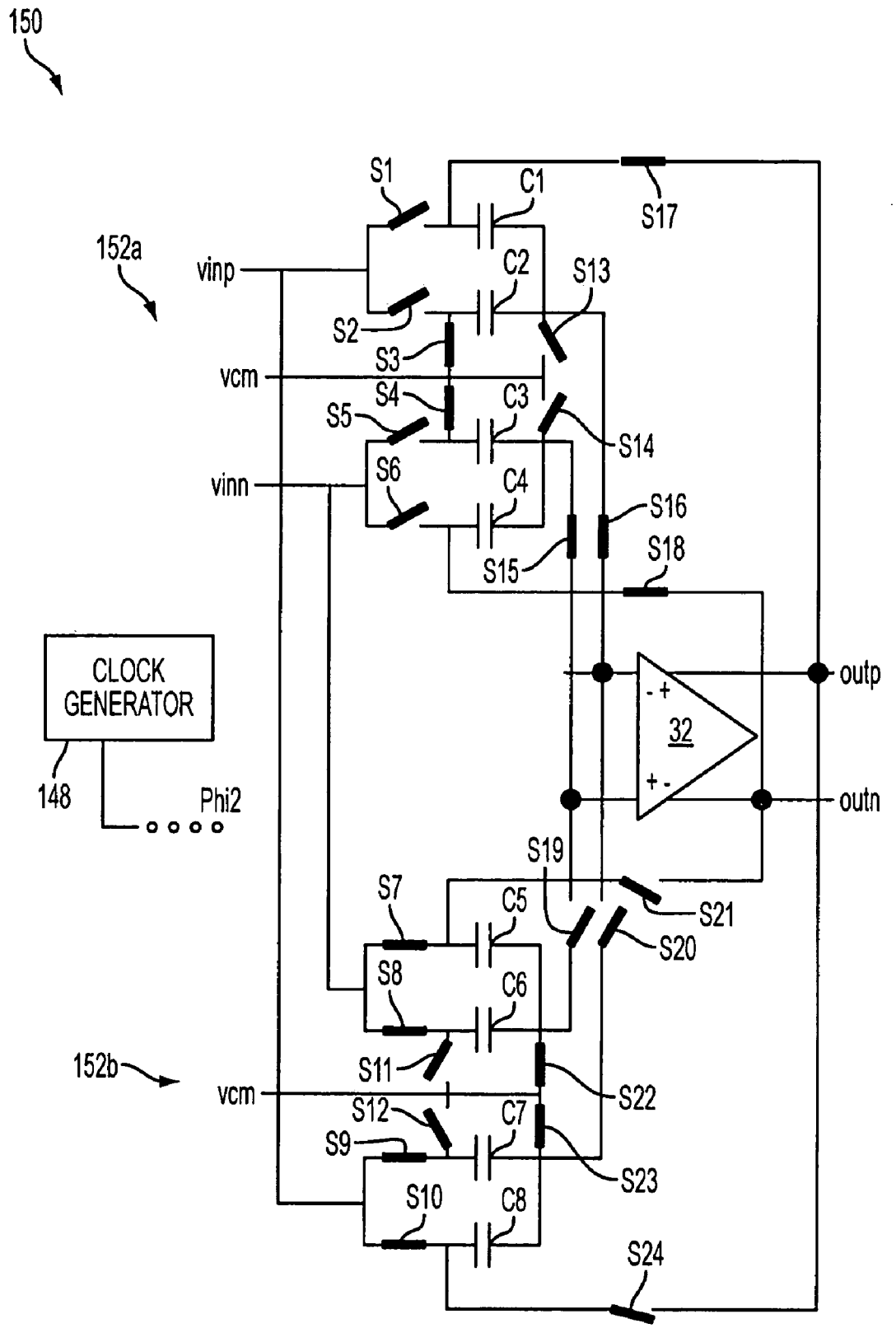

FIGS. 8a and 8b illustrate a portion of a conventional two-channel signal processing circuit 150 that shares an operational amplifier 32 between respective portions of the channels 152$_a$, 152$_b$. The first channel 152$_a$ comprises four capacitors C1, C2, C3, C4 and switches S1, S2, S3, S4, S5, S6, S13, S14, S15, S16, S17, S18. The second channel 152$_b$ comprises four capacitors C5, C6, C7, C8 and switches S7, S8, S9, S10, S11, S12, S19, S20, S21, S22, S23, S24. Between the two channels 152$_a$, 152$_b$, is a conventional folded cascode operational amplifier 32 (described below in more detail with respect to FIG. 9).

FIG. 8a illustrates the configuration for the two channels 152$_a$, 152$_b$ when the first clock signal PHI1 is asserted by the clock generator 148. When the first clock signal PHI1 is asserted, switches S1, S2, S5, S6, S13 and S14 are closed in the first channel 152$_a$ while switches S11, S12, S19, S20, S21 and S24 are closed in the second channel 152$_b$. This connects the first channel 152$_a$ to receive differential input signals Vinp, Vinn while the second channel 152$_b$ amplifies signals previously stored in capacitors C5, C6, C7 and C8. Vcm is a common mode voltage used to place charge on (or read charge out of) the capacitors C1-C8.

FIG. 8b illustrates the configuration for the two channels 152$_a$, 152$_b$ when the second clock signal PHI2 is asserted. When the second clock signal PHI2 is asserted, switches S3, S4, S15, S16, S17 and S18 are closed in the first channel 152$_a$ while switches S7, S8, S9, S10, S22 and S23 are closed in the second channel 152$_b$. This connects the second channel 152$_b$ to receive differential input signals Vinp, Vinn while the first channel 152$_a$ amplifies signals previously stored in capacitors C1-C4.

Figure 9:
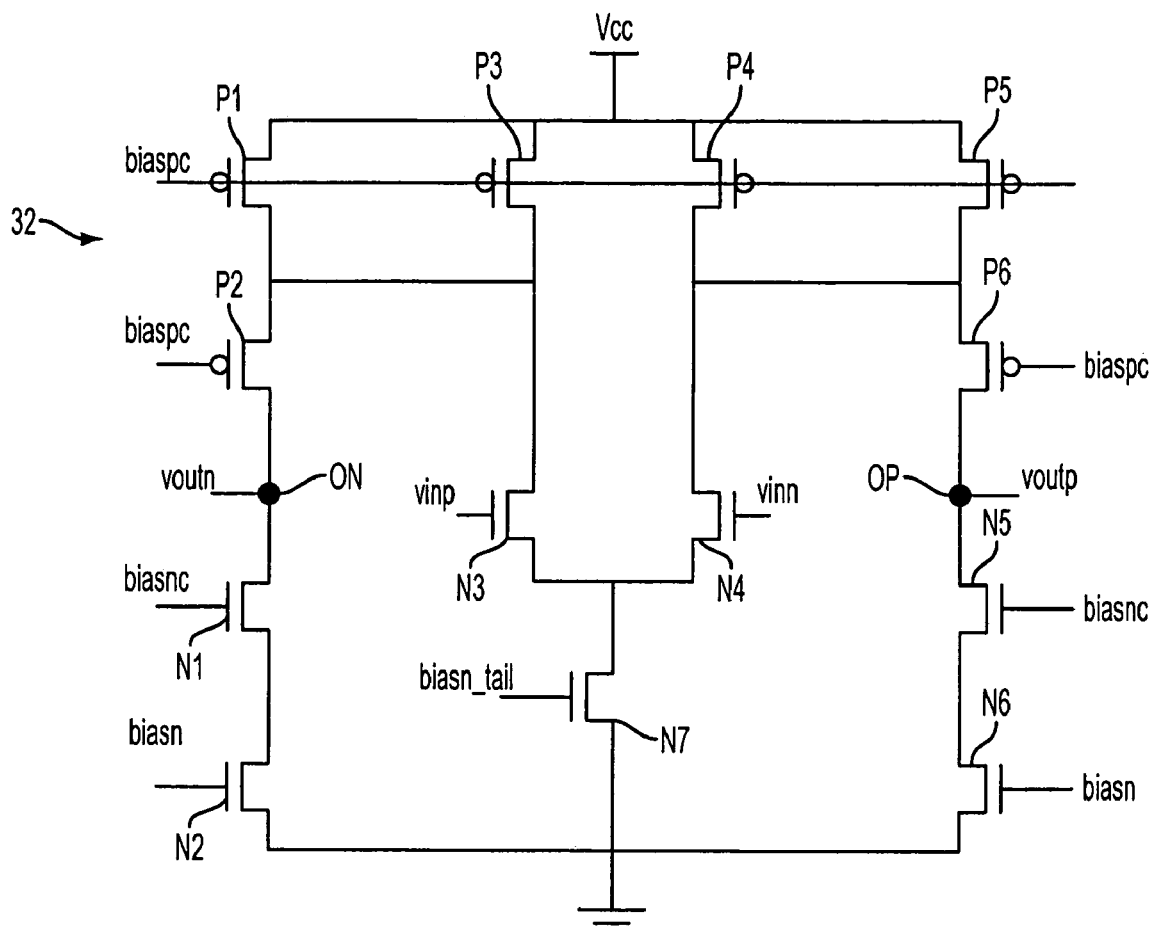
FIG. 9 illustrates a conventional folded cascode operational amplifier used in the circuits illustrated in FIGS. 8a and 8b.

FIG. 9 illustrates a conventional folded cascode operational amplifier 32 used in the circuit 150 illustrated in FIGS. 8a and 8b. The operational amplifier comprises six PMOS transistors P1, P2, P3, P4, P5, P6 and seven NMOS transistors N1, N2, N3, N4, N5, N6, N7. Transistors P1, P2, N1, N2 are serially connected between a voltage source Vcc and a ground potential. Transistors P5, P6, N5, N6 are serially connected between the voltage source Vcc and the ground potential. Transistors P3 and N3 are serially connected between the voltage source Vcc and a source/drain terminal of the seventh NMOS transistor N7. Transistors P4 and N4 are also serially connected between the voltage source Vcc and the same source/drain terminal of the seventh NMOS transistor N7. The connection between the first and second PMOS transistors P1, P2 is connected to the connection between the third PMOS and third NMOS transistors P3, N3. Similarly, the connection between the fifth and sixth PMOS transistors P5, P6 is connected to the connection between the fourth PMOS and fourth NMOS transistors P4, N4.

Input voltages Vinp, Vinn, described above, are respectively connected to the gates of the third and fourth NMOS transistors N3, N4. Output voltages Voutn, Voutp are respectively taken from output nodes ON, OP. The gates of transistors P1, P3, P4, and P5 are connected to a first bias voltage biasp. The gates of transistors P2 and P6 are connected to a second bias voltage biaspc. The gates of transistors N1 and N5 are connected to a third bias voltage biasnc. The gates of transistors N2 and N6 are connected to a fourth bias voltage biasn. The seventh NMOS transistor N7 has its gate connected to a bias control signal biasn_tail. The operational amplifier 32 is controlled by the bias voltages and generates the differential output voltages Voutn, Voutp based on the input voltages Vinn, Vinp. This type of operational amplifier typically offers high gain and fast settling times.

As stated above, the circuitry illustrated in FIGS. 8a, 8b and 9 suffers from the memory effect. Co-pending U.S. patent application Ser. No. 11/211,566, also assigned to Micron Technology, Inc., provides one solution to the memory effect problem and is hereby incorporated by reference in its entirety. The solution of the '566 application uses a discharge switch connected to an input of the operational amplifier and special timing to overcome the memory effect. The present application discloses other embodiments. Certain of these embodiments do not require a discharge switch or special timing. A first embodiment is now described with reference to FIGS. 10, 11a and 11b.

Figure 10:
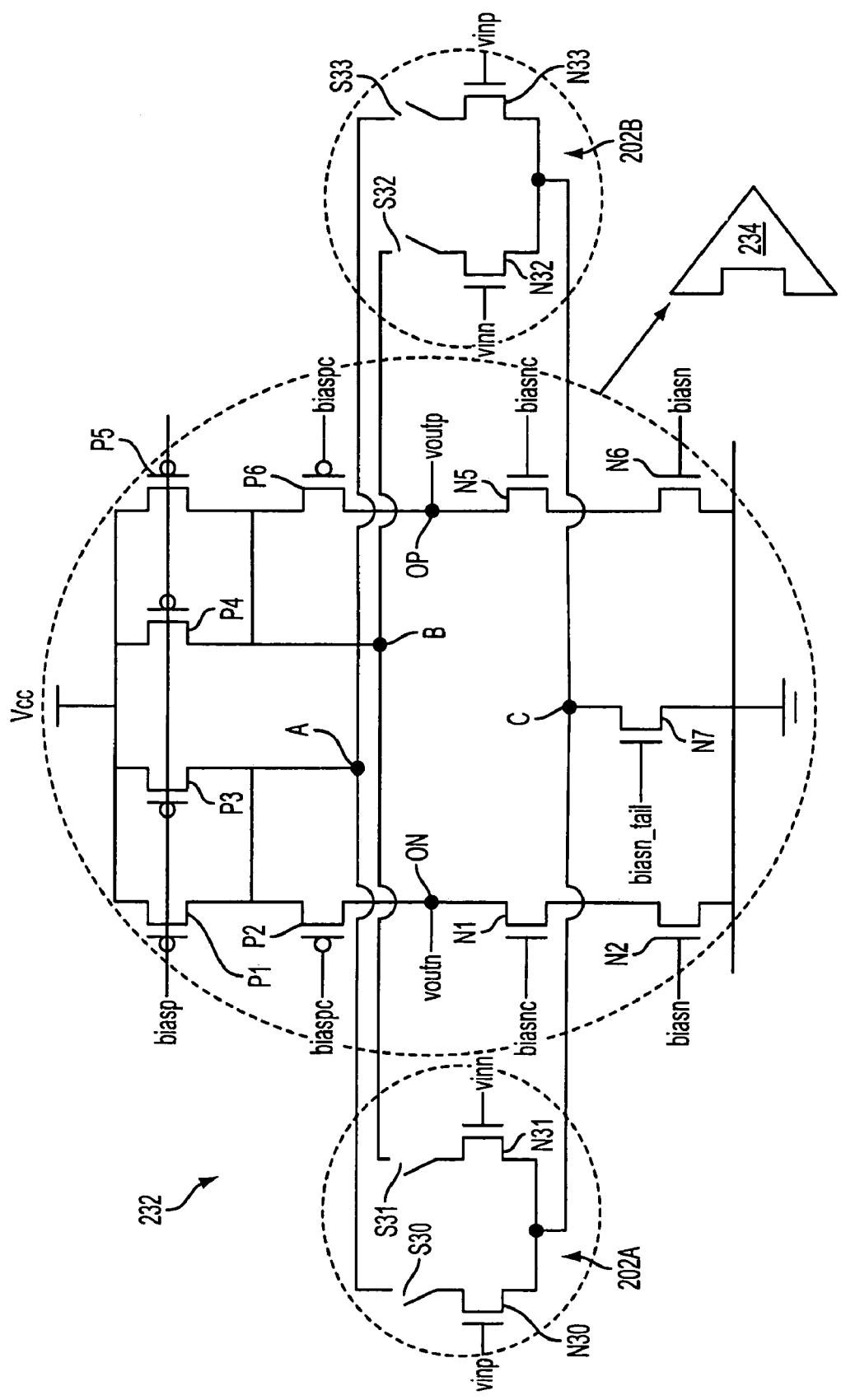
FIG. 10 illustrates a folded cascode operational amplifier constructed in accordance with an embodiment.

FIG. 10 illustrates a folded cascode operational amplifier 232 constructed in accordance with an embodiment. The illustrated amplifier 232 contains two input circuits 202A, 202B and amplifying circuitry, designated generally with reference numeral 234.

The first input circuit 202A contains two NMOS transistors N30, N31 and two switches S30, S31. A source/drain terminal of transistor N30 is connected to a source/drain terminal of transistor N31, which is also connected to node C within circuitry 234. The other source/drain terminal of transistor N30 is connected to node A within circuitry 234 through switch S30 while the other source/drain terminal of transistor N31 is connected to node B within circuitry 234 through switch S31. The gate of transistor N30 is connected to a first input voltage Vinp. The gate of transistor N31 is connected to a second input voltage Vinn.

The second input circuit 202B contains two NMOS transistors N32, N33 and two switches S32, S33. A source/drain terminal of transistor N32 is connected to a source/drain terminal of transistor N33, which is also connected to node C within circuitry 234. The other source/drain terminal of transistor N32 is connected to node B within circuitry 234 through switch S32 while the other source/drain terminal of transistor N33 is connected to node A within circuitry 234 through switch S33. The gate of transistor N33 is connected to receive the first input voltage Vinp. The gate of transistor N33 is connected to receive the second input voltage Vinn.

Thus, each input circuit 202A, 202B is connected to receive differential input voltages Vinp, Vinn. As will be described below with reference to FIGS. 11a and 11b, each input circuit 202A, 202B can be connected to a respective channel of a two-channel processing system. In addition, as will be described below with reference to FIGS. 14a-14d, each input circuit 202A, 202B can be connected to a respective stage within a shared pipelined analog-to-digital converter. In operation, the two input circuits 202A, 202B are time-multiplexed to share components within the remaining circuitry 234 of the amplifier 232 (described below).

The remaining circuitry 234 of the illustrated amplifier 232 contains similar components as the conventional amplifier 32 (FIG. 9) with the below noted exceptions. The third PMOS transistor P3 is connected between node A and the voltage source Vcc. The fourth PMOS transistor P4 is connected between node B and the voltage source Vcc. The seventh NMOS transistor N7 is connected between the ground potential and node C. The operation of the operational amplifier 232 of the first embodiment is now described with reference to FIGS. 11a and 11b, which illustrate a portion of a two-channel signal processing circuit 250 that shares operational amplifiers 232 between respective portions of the channels $252_a$, $252_b$.

The first channel $252_a$ comprises four capacitors C1, C2, C3, C4 and switches S1, S2, S3, S4, S5, S6, S13, S14, S17, and S18 and includes the second input circuit 202B of amplifier 232. The second channel $252_b$ comprises four capacitors C5, C6, C7, C8 and switches S7, S8, S9, S10, S11, S12, S21, S22, S23, and S24 and includes the first input circuit 202A of amplifier 232. Between the two channels $252_a$, $252_b$, is the remaining circuitry 234 of the folded cascode operational amplifier 232.

Figure 11A:
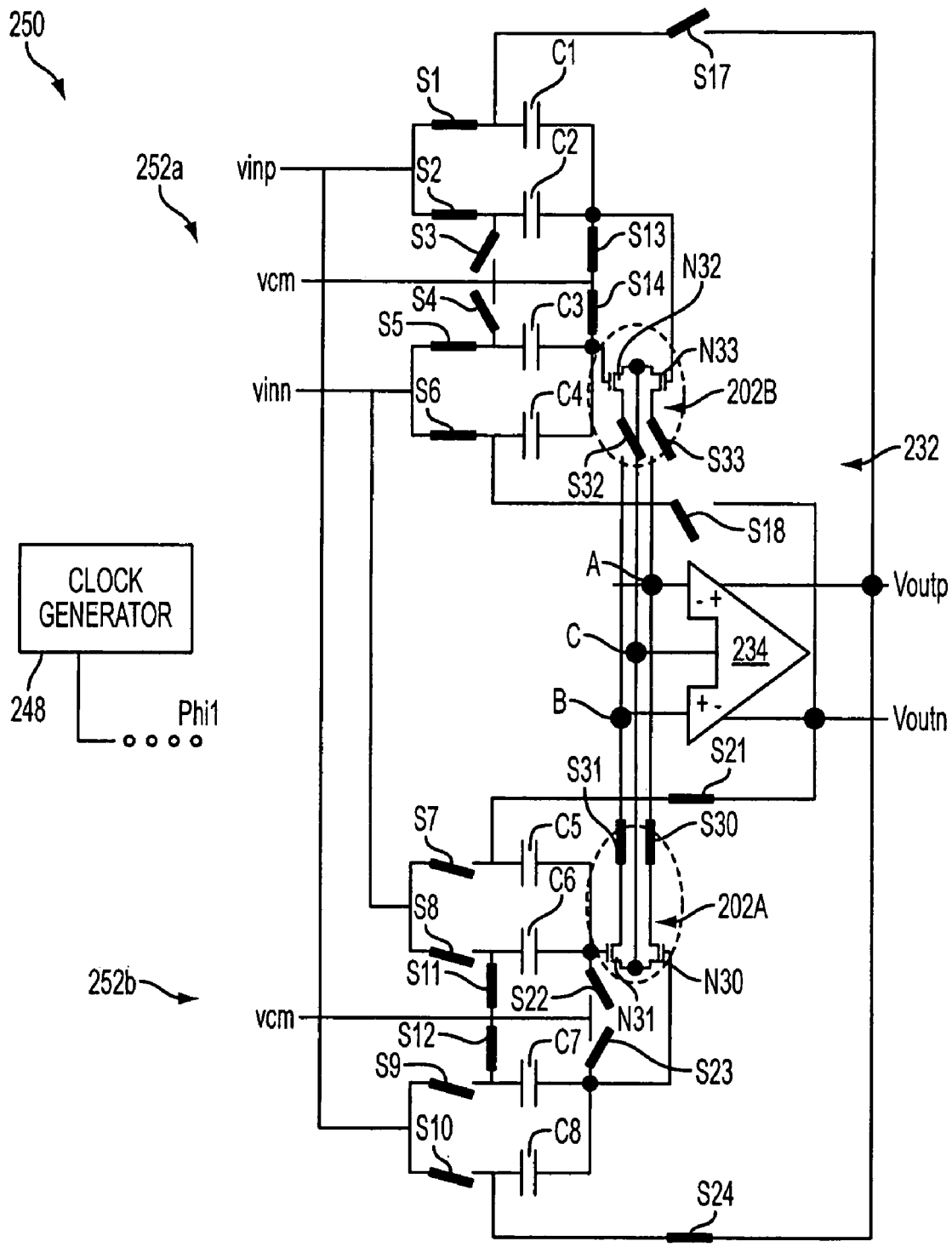
FIGS. 11a and 11b illustrate a portion of a two-channel signal processing circuit that shares operational amplifiers between respective portions of the channels constructed in accordance with an embodiment.

FIG. 11a illustrates the configuration for the two channels $252_a$, $252_b$ when the first clock signal PHI1 is generated and asserted by a clock generator 248. When the first clock signal PHI1 is asserted, switches S1, S2, S5, S6, S13 and S14 are closed in the first channel $252_a$ while switches S11, S12, S21 and S24 are closed in the second channel $252_b$. In addition, switches S30 and S31 are closed in the first input circuit 202A. This configuration connects the first channel $252_a$ to receive the differential input signals Vinp, Vinn while the second channel $252_b$ amplifies signals previously stored in capacitors C5, C6, C7 and C8. Vcm is a common mode voltage used to place charge on (or read charge out of) the capacitors C1-C8.

Figure 11B:
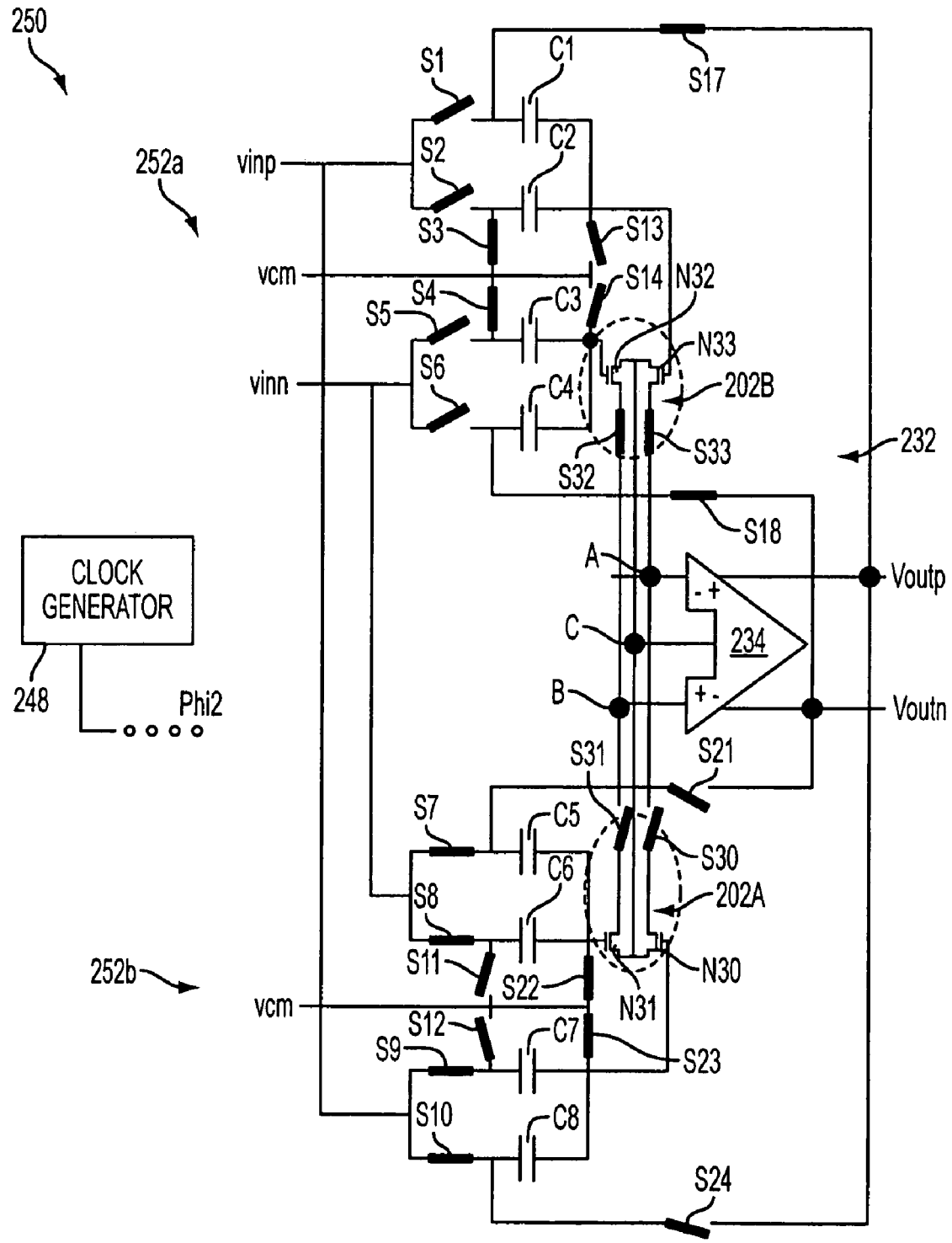

FIG. 11b illustrates the configuration for the two channels $252_a$, $252_b$ when the second clock signal PHI2 is generated and asserted by the clock generator 248. When the second clock signal PHI2 is asserted, switches S3, S4, S17 and S18 are closed in the first channel $252_a$, switches S7, S8, S9, S10, S22 and S23 are closed in the second channel $252_b$ and switches S32 and S33 are closed in the second input circuit 202B. This configuration connects the second channel $252_b$ to receive differential input signals Vinp, Vinn while the first channel $252_a$ amplifies signals previously stored in capacitors C1-C4.

Figure 1:
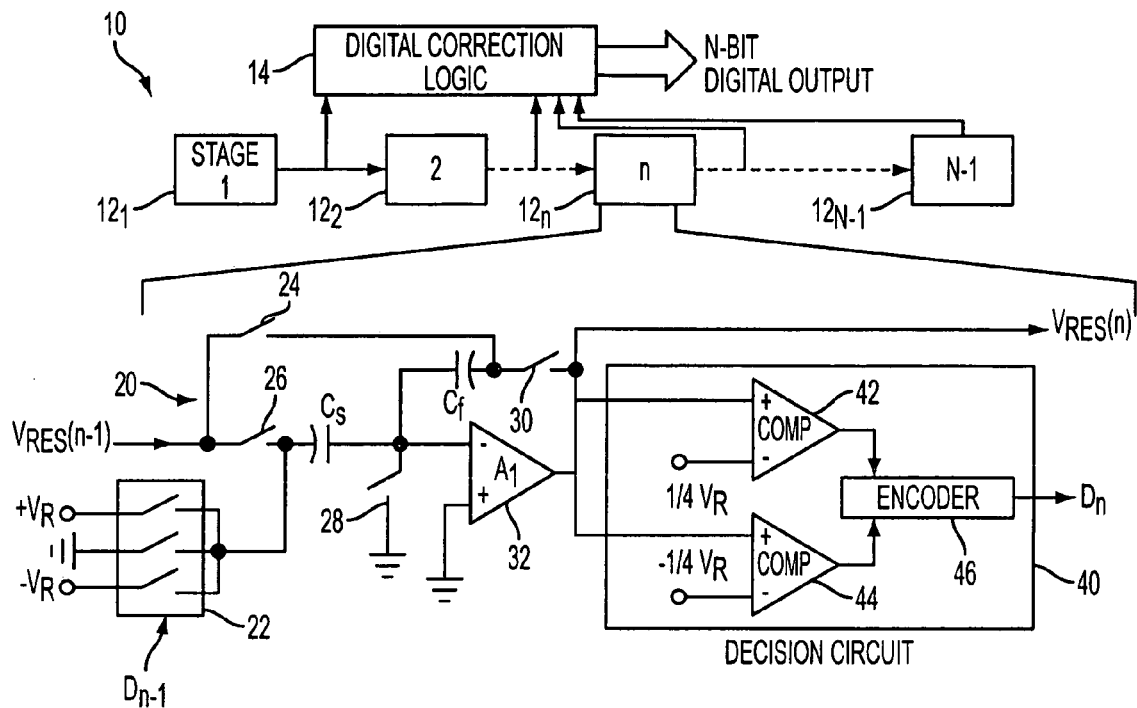
FIG. 1 is an illustration of a conventional N-bit pipelined analog-to-digital converter.
Figure 2:
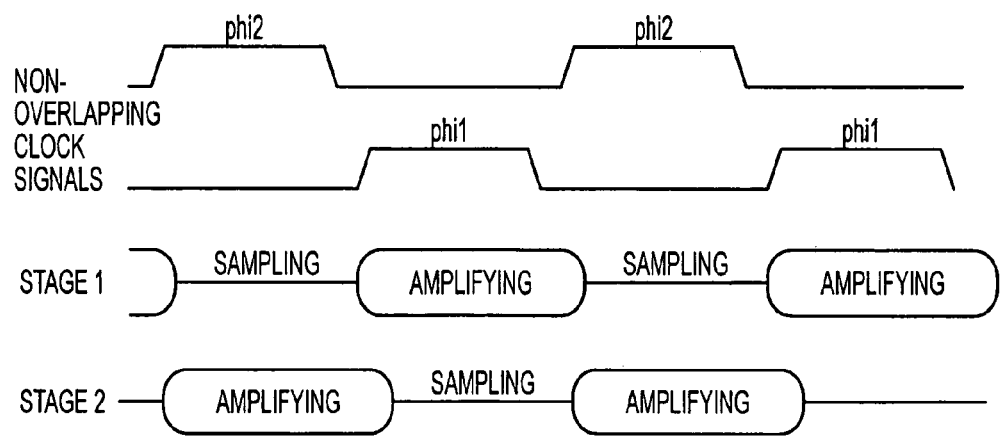
FIG. 2 is a timing diagram for two stages of the FIG. 1 pipelined analog-to-digital converter.
Figure 3:
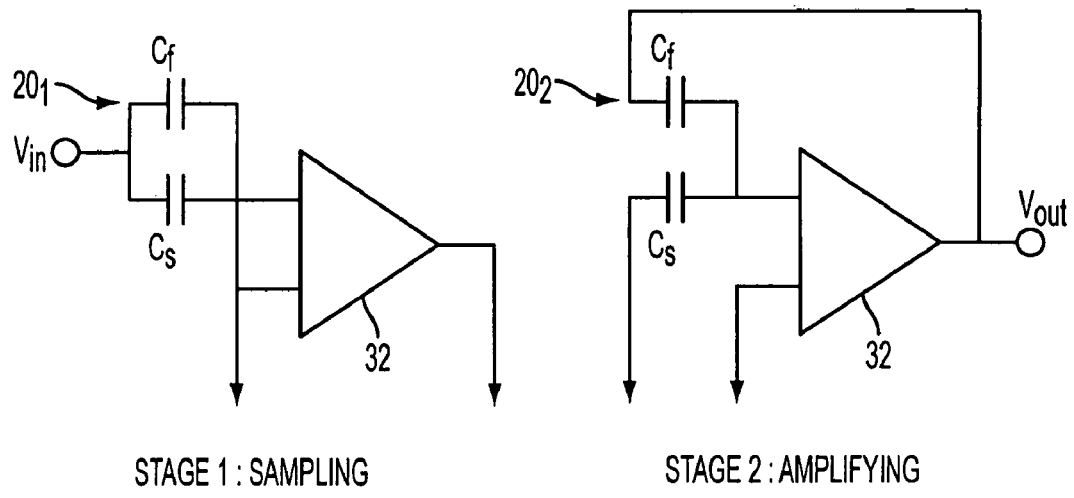
FIG. 3 illustrates the operational amplifier configuration of the two stages of the FIG. 1 pipelined analog-to-digital converter in accordance with one timing of the FIG. 2 timing diagram.
Figure 4:
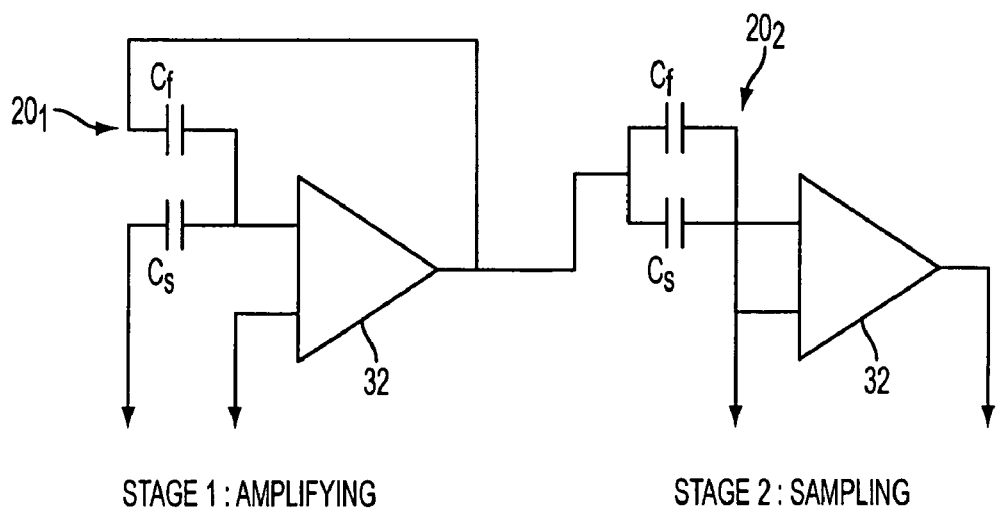
FIG. 4 illustrates the operational amplifier configuration of the two stages of the FIG. 1 pipelined analog-to-digital converter in accordance with a second timing of the FIG. 2 timing diagram.
Figure 6:
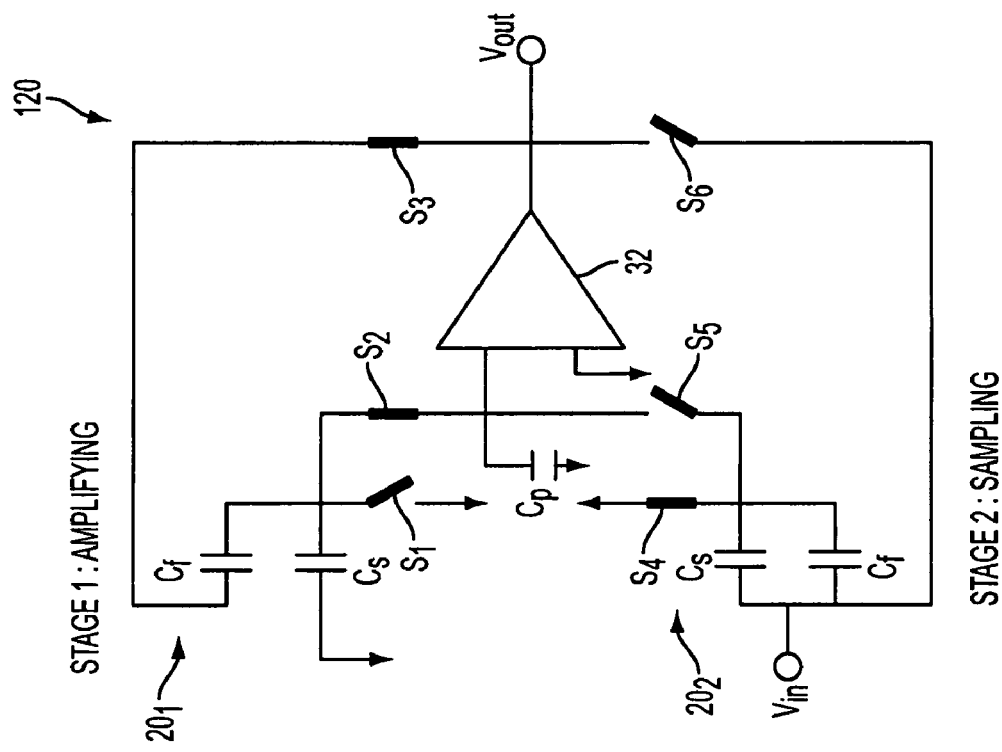
FIG. 6 illustrates a second shared operational amplifier configuration of the two stages of the FIG. 1 pipelined analog-to-digital converter in accordance with a second timing of the FIG. 2 timing diagram.
Figure 5:
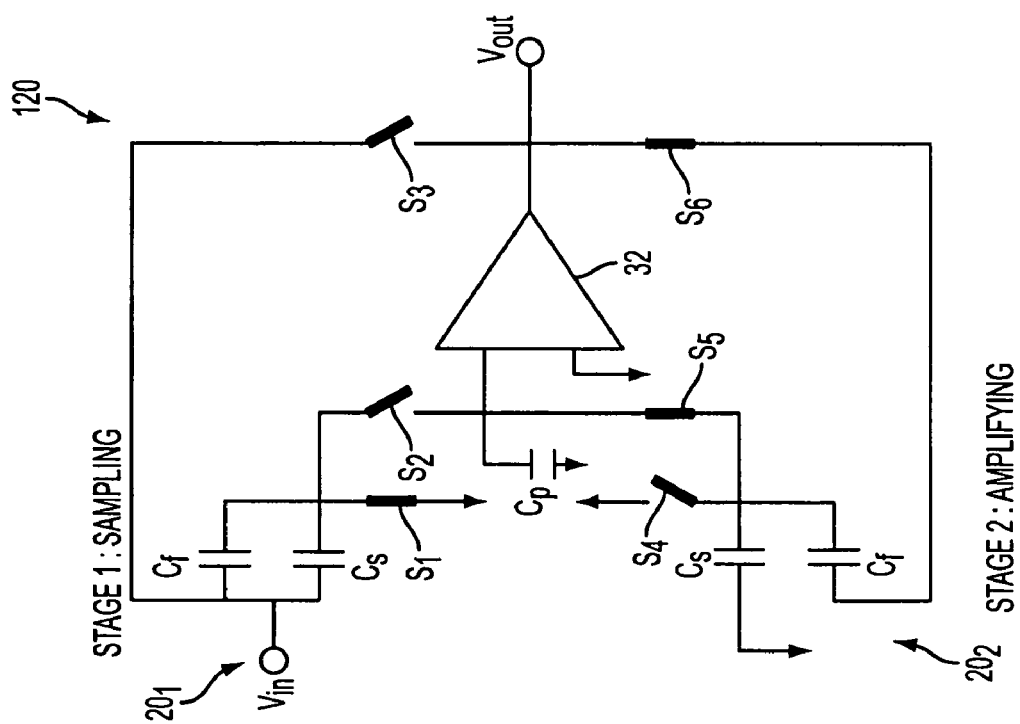
FIG. 5 illustrates a first shared operational amplifier configuration of the two stages of the FIG. 1 pipelined analog-to-digital converter in accordance with one timing of the FIG. 2 timing diagram.
Figure 7A:
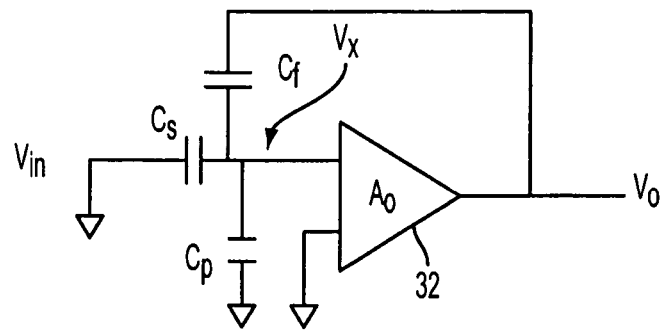
FIGS. 7a and 7b illustrate by comparison the memory effect that arises in the shared operational amplifier configuration of the two stages of the FIG. 1 pipelined analog-to-digital converter.
Figure 7B:
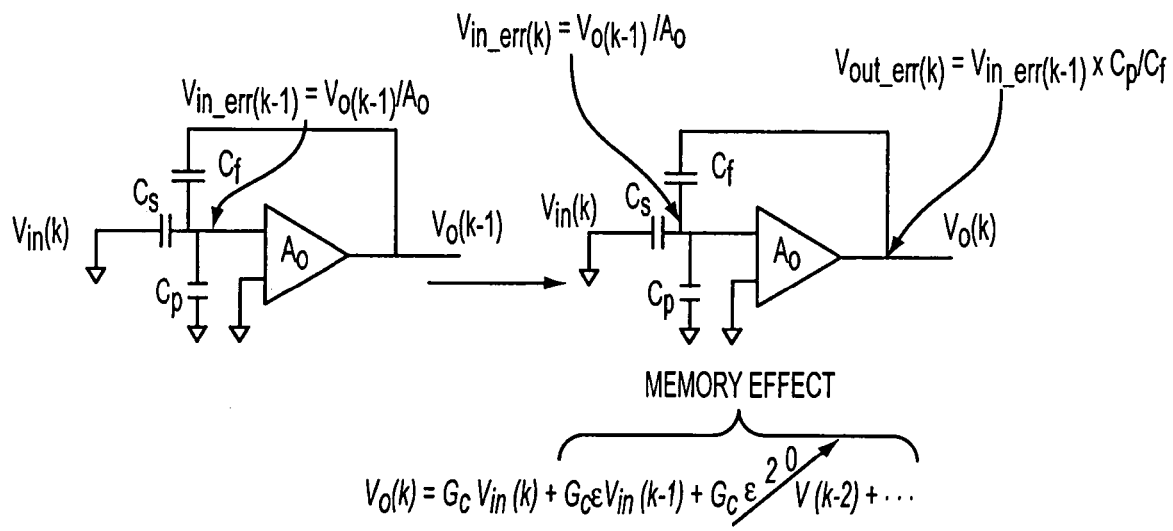
Figure 7C:
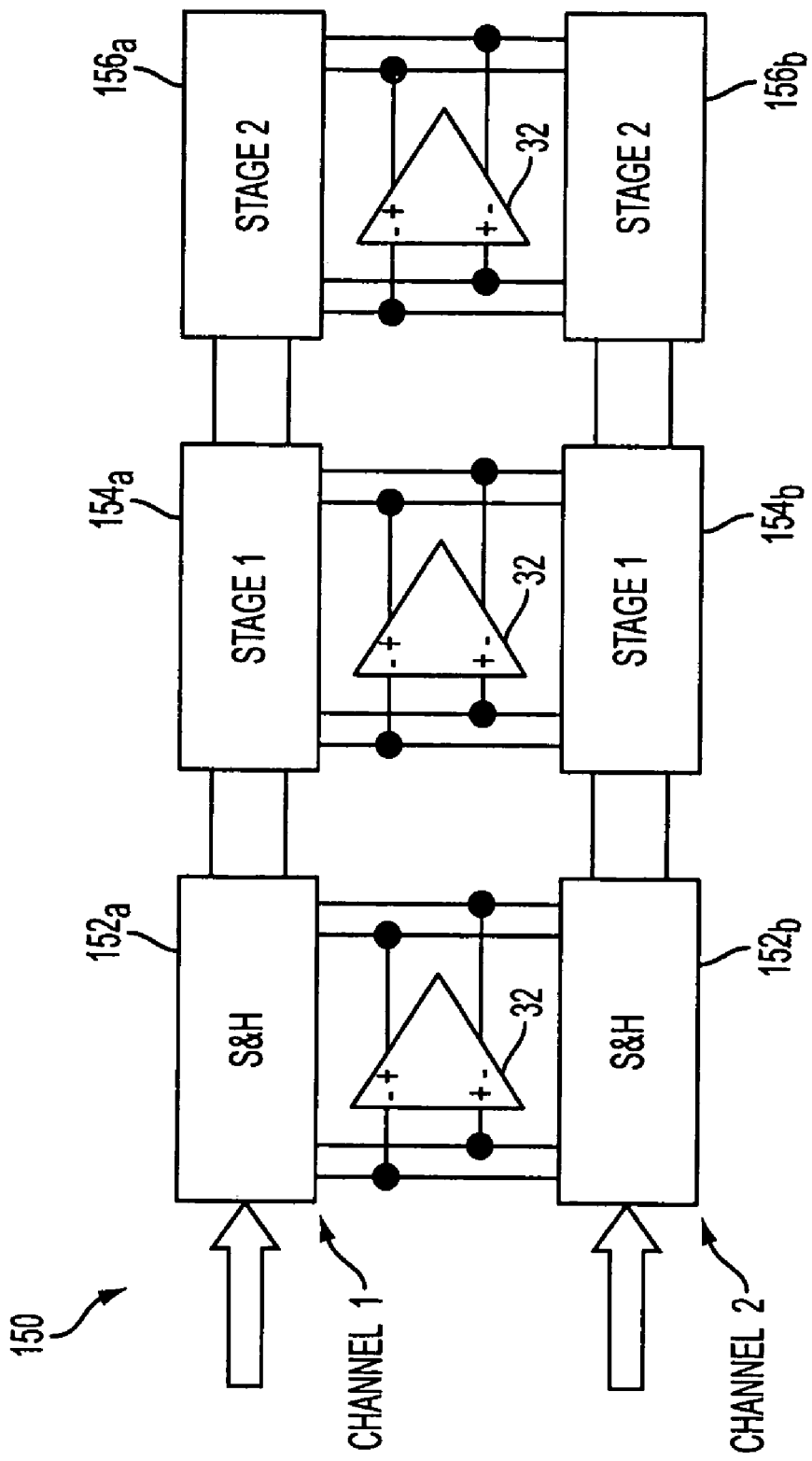
FIG. 7c illustrates a two channel signal processing circuit that shares operational amplifiers between respective portions of the channels.

Therefore, as can be seen from FIGS. 11a and 11b, during the sampling operations, the input nodes of the input circuits 202A, 202B are connected to the common mode voltage Vcm or to each other so that the differential voltage stored in the input circuits 202A, 202B are removed. This means that the circuitry 250, using the operational amplifier 232, uses the entire sampling period to remove the memory effect (i.e., discharges any parasitic capacitance in the input circuitry) and thus, does not sacrifice the settling time of the operational amplifier 232. Moreover, the operation of the amplifier 232 and the circuitry 250 is exactly the same as, and uses the same timing, as the conventional circuitry. That is, the amplifier 232 and circuitry 250 operate in accordance with the timing diagram illustrated in FIG. 2. Therefore, no additional timing or operations are required, which means that the clock generator 248 may be a simple or conventional generator.

Accordingly, the advantages of the first operational amplifier 232 include: (1) reducing the residual error associated with parasitic capacitance; (2) using more of the sampling period to reduce the residual error; (3) achieving low power consumption without adversely impacting the settling time of the amplifier 232; and (4) limiting or not requiring timing changes or additional timing circuitry to implement.

Figure 12:
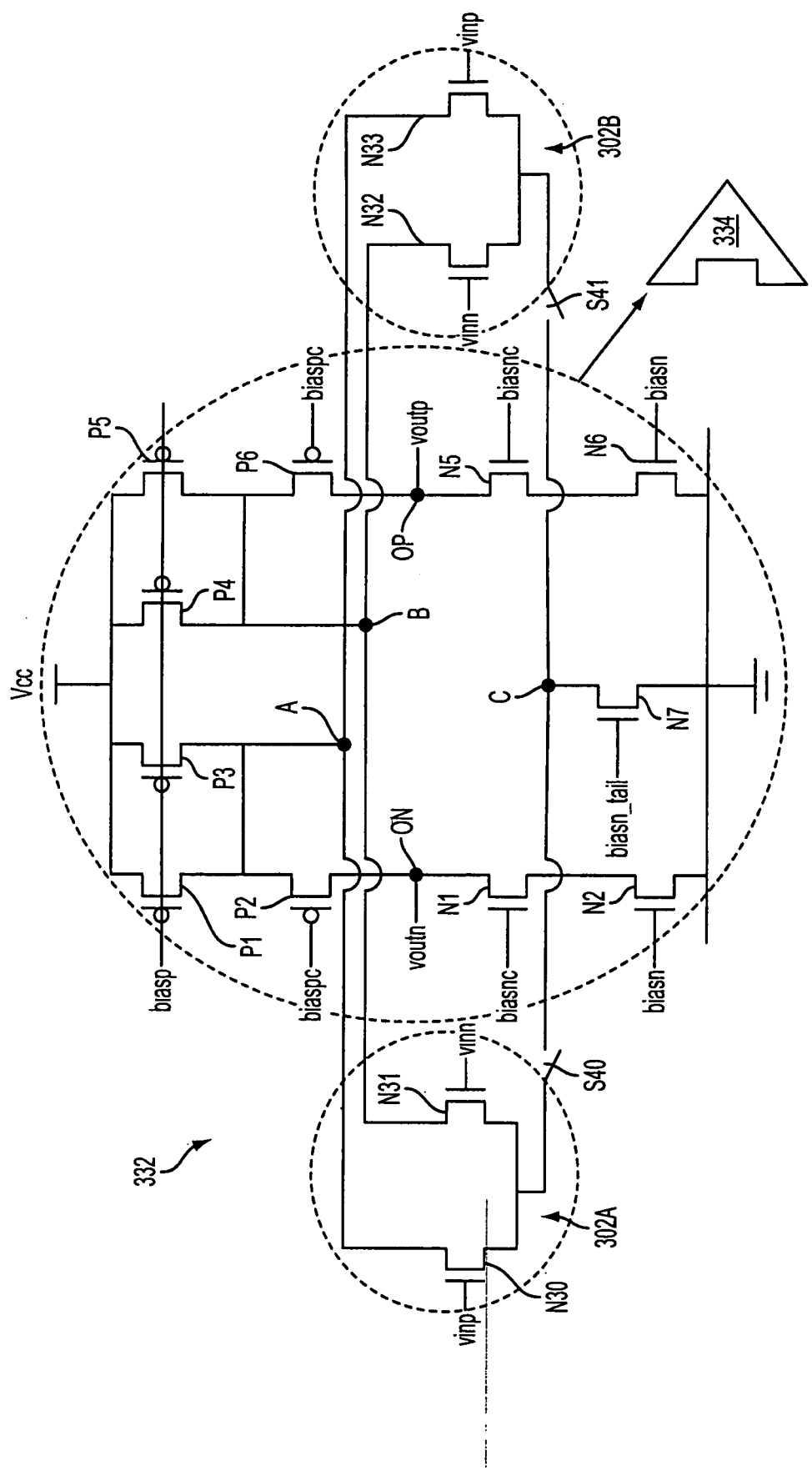
FIG. 12 illustrates another folded cascode operational amplifier constructed in accordance with another embodiment.

FIG. 12 illustrates another folded cascode operational amplifier 332 constructed in accordance with another embodiment. The illustrated amplifier 332 contains two input circuits 302A, 302B and amplifying circuitry, designated generally with reference numeral 334.

The first input circuit 302A contains two NMOS transistors N30, N31, but only one switch S40. A source/drain terminal of transistor N30 is connected to a source/drain terminal of transistor N31, which is also connected to node C within circuitry 334 through switch S40. The other source/drain terminal of transistor N30 is connected to node A within circuitry 334 while the other source/drain terminal of transistor N31 is connected to node B within circuitry 334. The gate of transistor N30 is connected to a first input voltage Vinp. The gate of transistor N31 is connected to a second input voltage Vinn.

The second input circuit 302B contains two NMOS transistors N32, N33 and one switch S41. A source/drain terminal of transistor N32 is connected to a source/drain terminal of transistor N33, which is also connected to node C within circuitry 334 through switch S41. The other source/drain terminal of transistor N32 is connected to node B within circuitry 334 while the other source/drain terminal of transistor N33 is connected to node A within circuitry 334. The gate of transistor N33 is connected to receive the first input voltage Vinp. The gate of transistor N33 is connected to receive the second input voltage Vinn.

Thus, each input circuit 302A, 302B is connected to receive differential input voltages Vinp, Vinn. As will be described below with reference to FIGS. 13a and 13b, each input circuit 302A, 302B can be connected to a respective channel of a two-channel processing system. In addition, as will be described below with reference to FIGS. 14e-14h, each input circuit 302A, 302B can be connected to a respective stage within a shared pipelined analog-to-digital converter. In operation, the two input circuits 302A, 302B are time-multiplexed to share components within the remaining circuitry 334 of the amplifier 332 (described below).

The remaining circuitry 334 of the illustrated amplifier 332 contains the same components as the components contained in the first embodiment (FIG. 10). The operation of the operational amplifier 332 of the second embodiment is now described with reference to FIGS. 13a and 13b, which illustrate a portion of a two-channel signal processing circuit 350 that shares operational amplifiers 332 between respective portions of the channels $352_a$, $352_b$.

The first channel $352_a$ comprises four capacitors C1, C2, C3, C4 and switches S1, S2, S3, S4, S5, S6, S13, S14, S17, and S18 and includes the second input circuit 302B of amplifier 332. The second channel $352_b$ comprises four capacitors C5, C6, C7, C8 and switches S7, S8, S9, S10, S11, S12, S21, S22, S23, and S24 and includes the first input circuit 302A of amplifier 332. Between the two channels 352$_a$, 352$_b$, is the remaining circuitry 334 of the folded cascode operational amplifier 332.

Figure 13A:
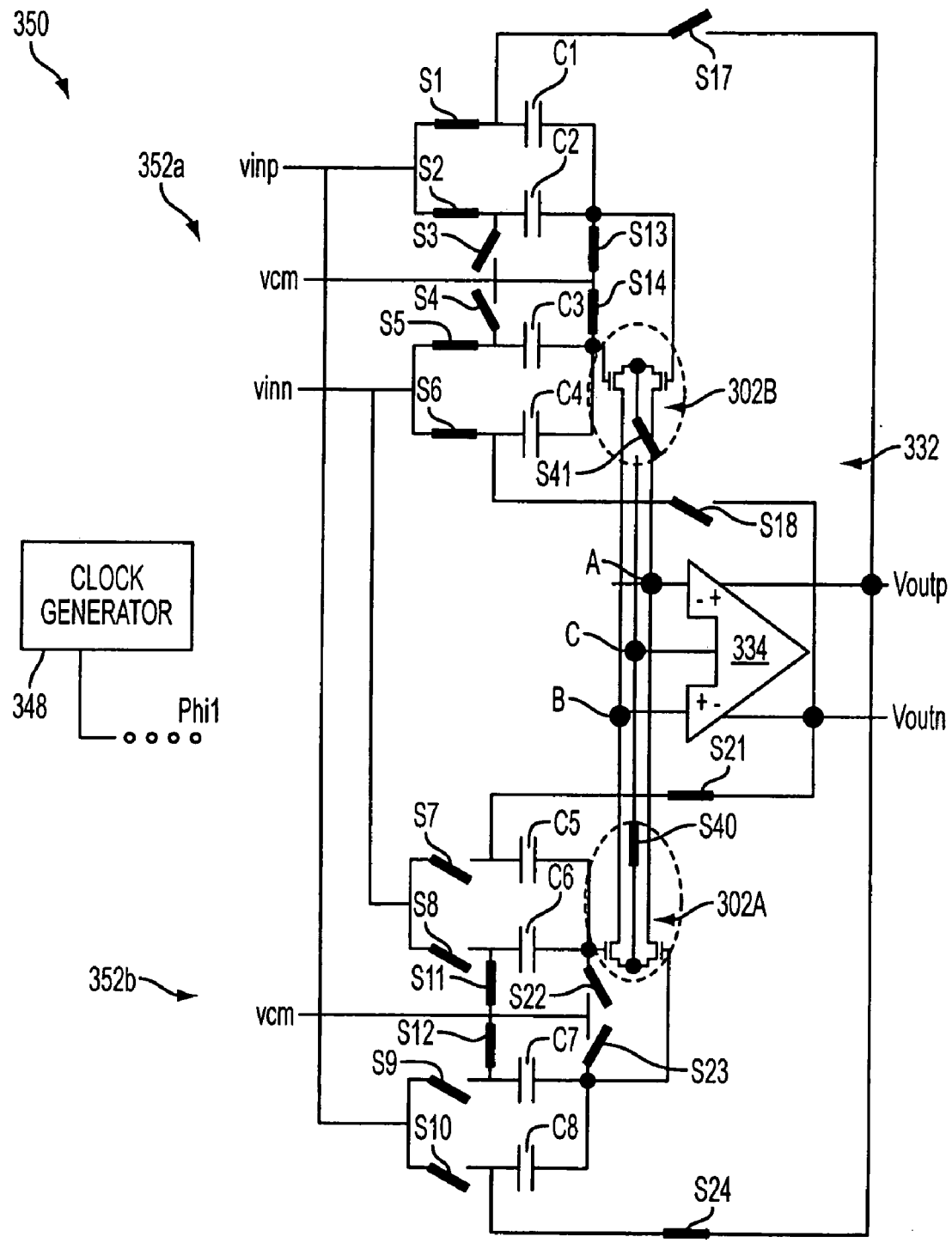
FIGS. 13a and 13b illustrate a portion of another two-channel signal processing circuit that shares operational amplifiers between respective portions of the channels constructed in accordance with another embodiment.

FIG. 13a illustrates the configuration for the two channels 352$_a$, 352$_b$ when the first clock signal PHI1 is generated and asserted by a clock generator 348. As with the first embodiment, the generator 348 generates the first and second clock signals PHI1, PHI2 at the timing illustrated in FIG. 2. When the first clock signal PHI1 is asserted, switches S1, S2, S5, S6, S13 and S14 are closed in the first channel 352$_a$ while switches S11, S12, S21 and S24 are closed in the second channel 352$_b$. In addition, switch S40 is closed in the first input circuit 302A. This configuration connects the first channel 352$_a$ to receive the differential input signals Vinp, Vinn while the second channel 352$_b$ amplifies signals previously stored in capacitors C5, C6, C7 and C8. Vcm is a common mode voltage used to place charge on (or read charge out of) the capacitors C1-C8.

Figure 13B:
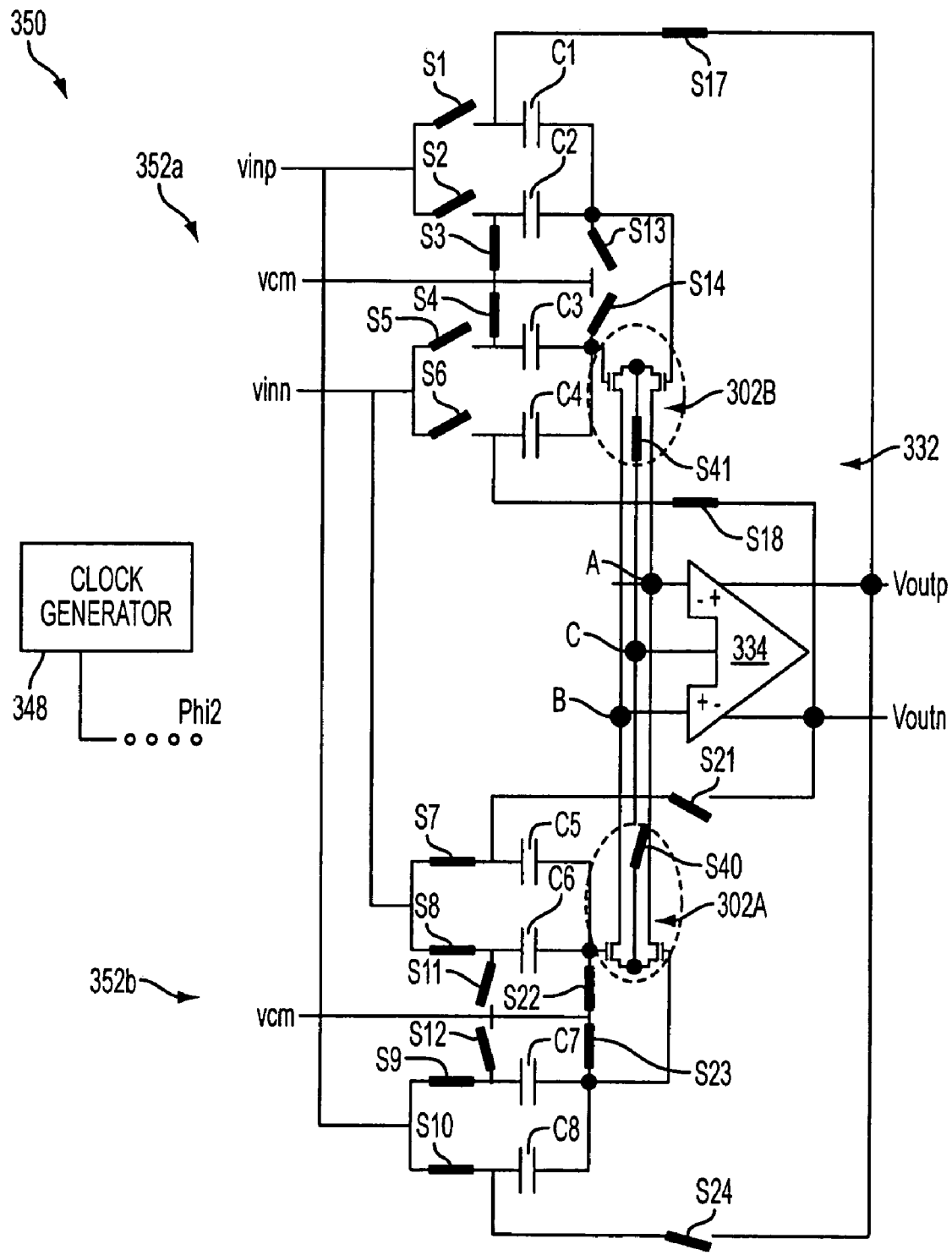

FIG. 13b illustrates the configuration for the two channels 352$_a$, 352$_b$ when the second clock signal PHI2 is generated and asserted by the clock generator 348. When the second clock signal PHI2 is asserted, switches S3, S4, S17 and S18 are closed in the first channel 352$_a$, switches S7, S8, S9, S10, S22 and S23 are closed in the second channel 352$_b$ and switch S41 is closed in the second input circuit 302B. This configuration connects the second channel 352$_b$ to receive differential input signals Vinp, Vinn while the first channel 352$_a$ amplifies signals previously stored in capacitors C1-C4. As can be seen, since the generator 348 generates the first and second clock signals PHI1, PHI2 at the timing illustrated in FIG. 2, the amplifier 332 and circuitry 350 achieve the same advantages as the first embodiment described above.

Figure 14A:
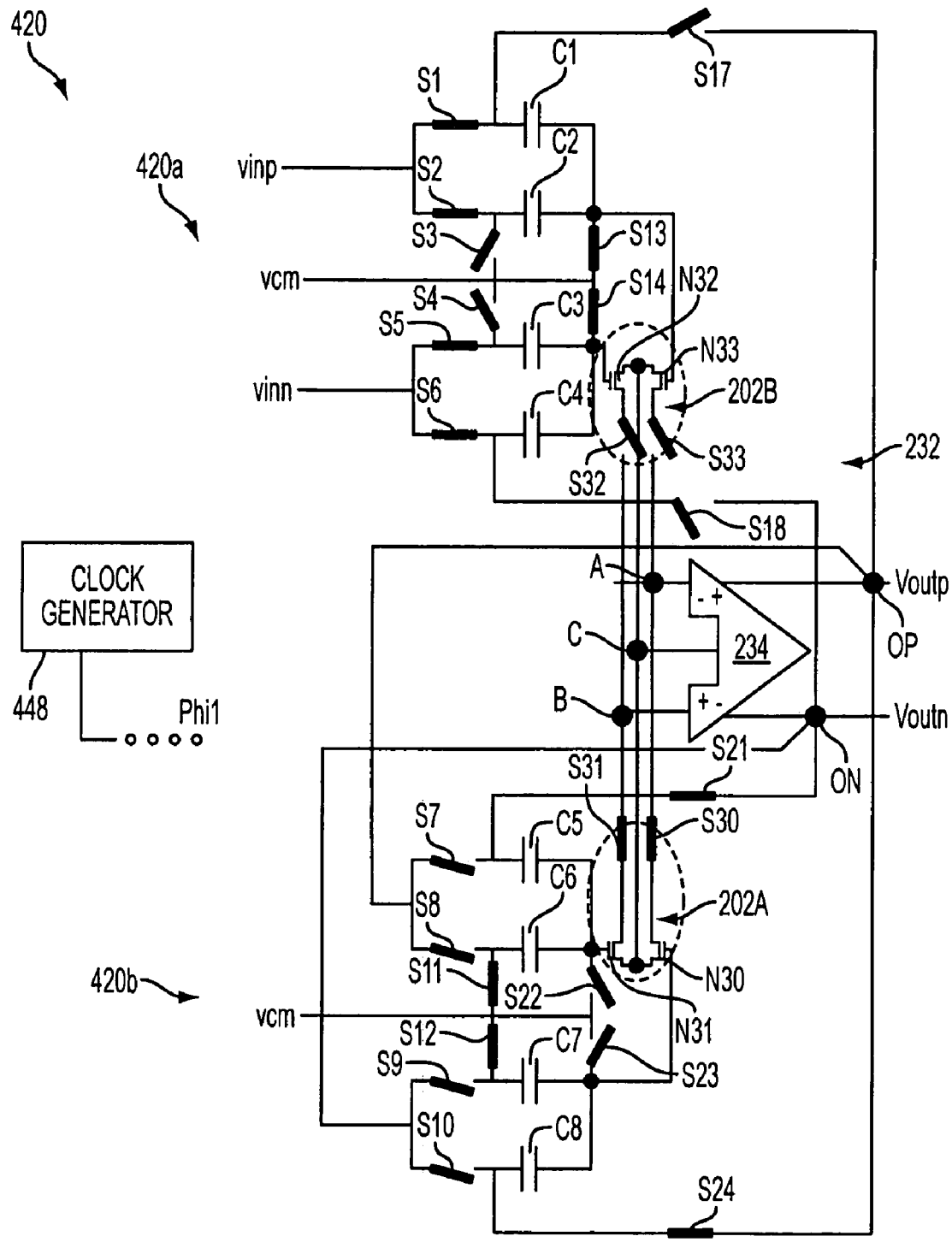
FIGS. 14a and 14b illustrate a circuit portion of two stages of a pipelined analog-to-digital converter which share an operational amplifier constructed in accordance with an embodiment.
Figure 14B:
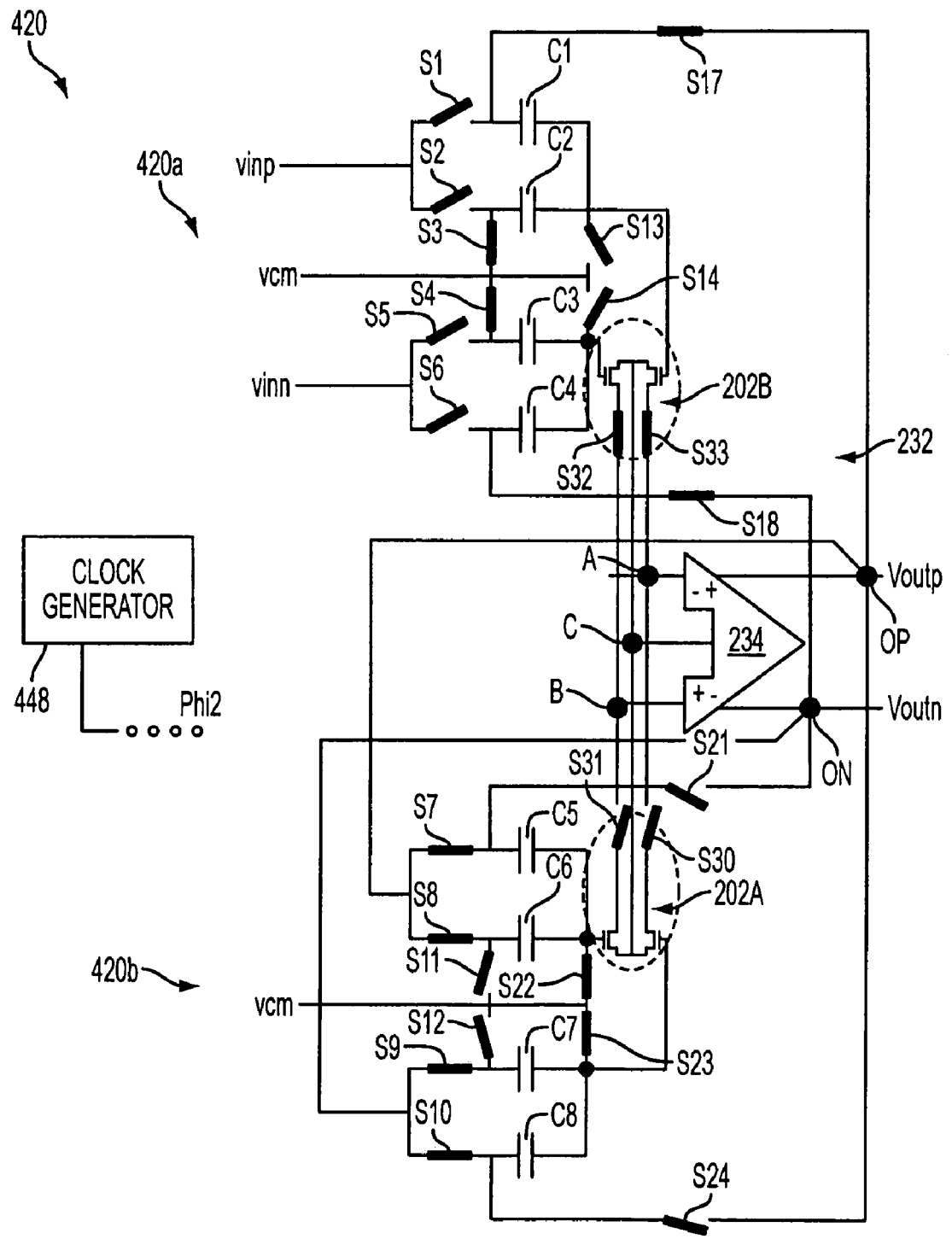

FIGS. 14a and 14b illustrate a circuit portion 420 of two stages 420$_a$, 420$_b$ of a pipelined analog-to-digital converter which share an operational amplifier 232 constructed in accordance with an embodiment. The first stage 420$_a$ comprises four capacitors C1, C2, C3, C4 and switches S1, S2, S3, S4, S5, S6, S13, S14, S17 and S18 and includes the second input circuit 202B of amplifier 232. The second stage 420$_b$ comprises four capacitors C5, C6, C7, C8 and switches S7, S8, S9, S10, S11, S12, S21, S22, S23, and S24 and includes the first input circuit 202A of amplifier 232. The connection between switches S9 and S10 is connected to output node OP while the connection between switches S7 and S8 is connected to output node ON. Between the two stages 420$_a$, 420$_b$, is the remaining circuitry 234 of the folded cascode operational amplifier 232 described above.

FIG. 14a illustrates the configuration for the two stages 420$_a$, 420$_b$ when the first clock signal PHI1 is generated and asserted by a clock generator 448. As with other embodiments, the generator 448 generates the first and second clock signals PHI1, PHI2 at the timing illustrated in FIG. 2. When the first clock signal PHI1 is asserted, switches S1, S2, S5, S6, S13 and S14 are closed in the first stage 420$_a$ while switches S11, S12, S21 and S24 are closed in the second stage 420$_b$. In addition, switches S30 and S31 are closed in the first input circuit 202A. This configuration connects the first stage 420$_a$ to receive the differential input signals Vinp, Vinn while the second stage 420$_b$ amplifies signals previously stored in capacitors C5, C6, C7 and C8. Vcm is a common mode voltage used to place charge on (or read charge out of) the capacitors C1-C8.

FIG. 14b illustrates the configuration for the two stages 420$_a$, 420$_b$ when the second clock signal PHI2 is generated and asserted by the clock generator 448. When the second clock signal PHI2 is asserted, switches S3, S4, S17 and S18 are closed in the first stage 420$_a$, switches S7, S8, S9, S10, S22 and S23 are closed in the second stage 420$_b$ and switches S32 and S33 are closed in the second input circuit 202B. This configuration connects the second stage 420$_b$ to receive differential input signals Vinp, Vinn while the first stage 420$_a$ amplifies signals previously stored in capacitors C1-C4. As can be seen, since the generator 448 generates the first and second clock signals PHI1, PHI2 at the timing illustrated in FIG. 2, the amplifier 232 and circuitry 420 achieve the same advantages as the other embodiments described above.

Figure 14C:
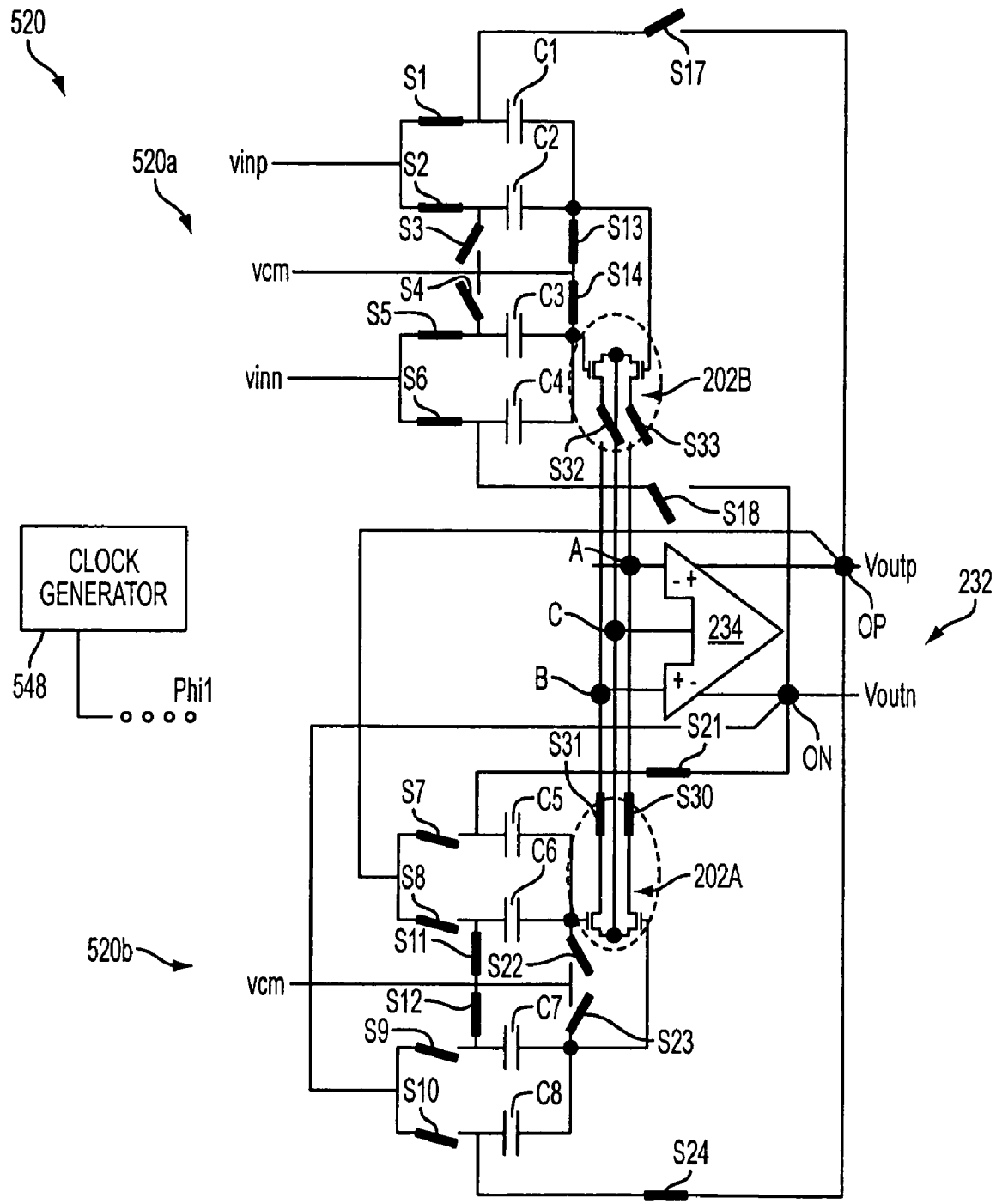
FIGS. 14c and 14d illustrate another circuit portion of two stages of a pipelined analog-to-digital converter which share an operational amplifier constructed in accordance with an embodiment.
Figure 14D:
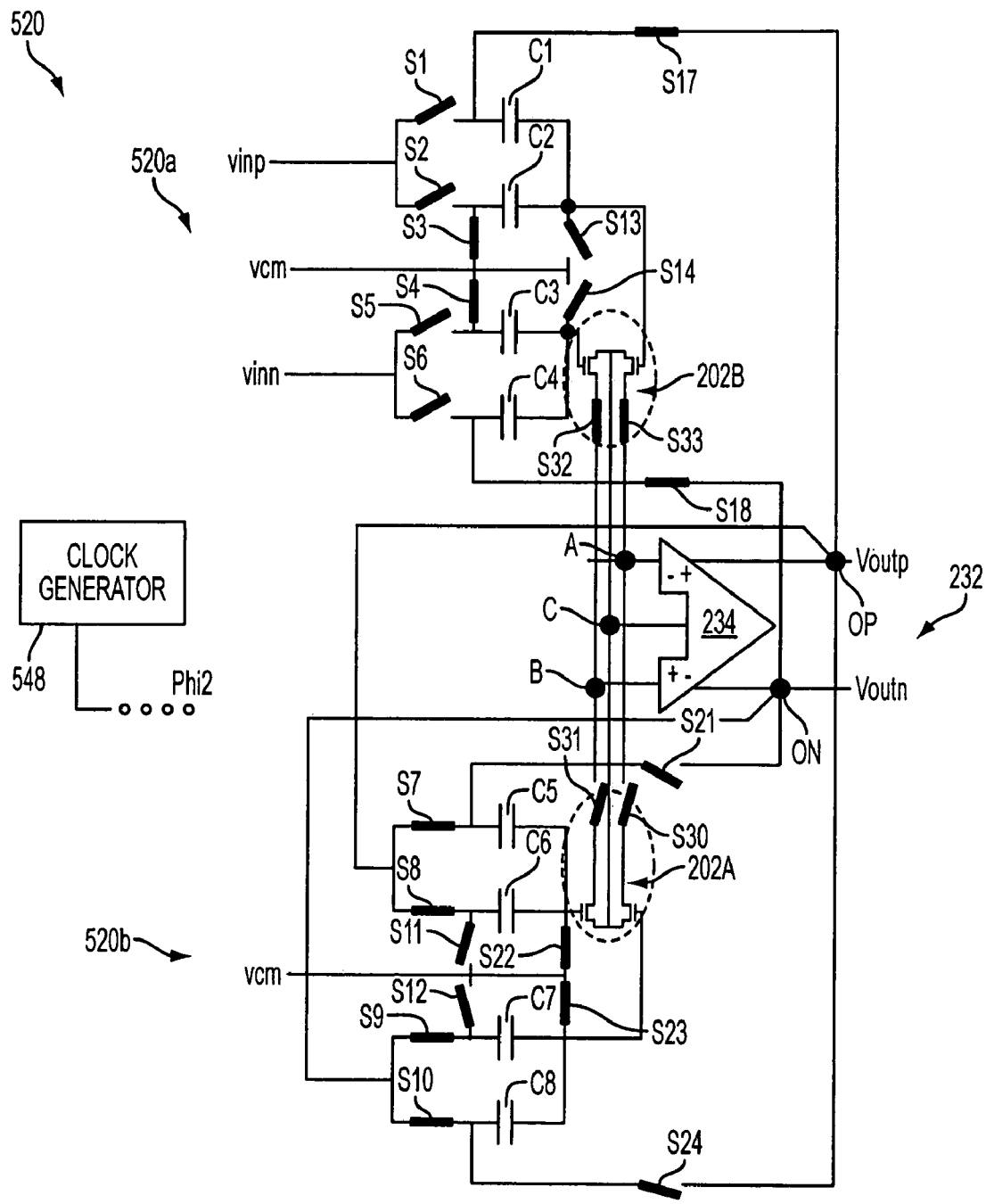

FIGS. 14c and 14d illustrate a circuit portion 520 of two stages 520$_a$, 520$_b$ of a pipelined analog-to-digital converter which share an operational amplifier 232 constructed in accordance with an embodiment. The first stage 520$_a$ comprises four capacitors C1, C2, C3, C4 and switches S1, S2, S3, S4, S5, S6, S13, S14, S17 and S18 and includes the second input circuit 202B of amplifier 232. The second stage 520$_b$ comprises four capacitors C5, C6, C7, C8 and switches S7, S8, S9, S10, S11, S12, S21, S22, S23, and S24 and includes the first input circuit 202A of amplifier 232. In this embodiment, the connection between switches S9 and S10 is connected to output node ON while the connection between switches S7 and S8 is connected to output node OP. Between the two stages 520$_a$, 520$_b$, is the remaining circuitry 234 of the folded cascode operational amplifier 232 described above.

FIG. 14c illustrates the configuration for the two stages 520$_a$, 520$_b$ when the first clock signal PHI1 is generated and asserted by a clock generator 548. As with other embodiments, the generator 548 generates the first and second clock signals PHI1, PHI2 at the timing illustrated in FIG. 2. When the first clock signal PHI1 is asserted, switches S1, S2, S5, S6, S13 and S14 are closed in the first stage 520$_a$ while switches S11, S12, S21 and S24 are closed in the second stage 520$_b$. In addition, switches S30 and S31 are closed in the first input circuit 202A. This configuration connects the first stage 520$_a$ to receive the differential input signals Vinp, Vinn while the second stage 520$_b$ amplifies signals previously stored in capacitors C5, C6, C7 and C8. Vcm is a common mode voltage used to place charge on (or read charge out of) the capacitors C1-C8.

FIG. 14d illustrates the configuration for the two stages 520$_a$, 520$_b$ when the second clock signal PHI2 is generated and asserted by the clock generator 548. When the second clock signal PHI2 is asserted, switches S3, S4, S17 and S18 are closed in the first stage 520$_a$, switches S7, S8, S9, S10, S22 and S23 are closed in the second stage 520$_b$ and switches S32 and S33 are closed in the second input circuit 202B. This configuration connects the second stage 520$_b$ to receive differential input signals Vinp, Vinn while the first stage 520$_a$ amplifies signals previously stored in capacitors C1-C4. As can be seen, since the generator 548 generates the first and second clock signals PHI1, PHI2 at the timing illustrated in FIG. 2, the amplifier 232 and circuitry 520 achieve the same advantages as the other embodiments described above.

Figure 14E:
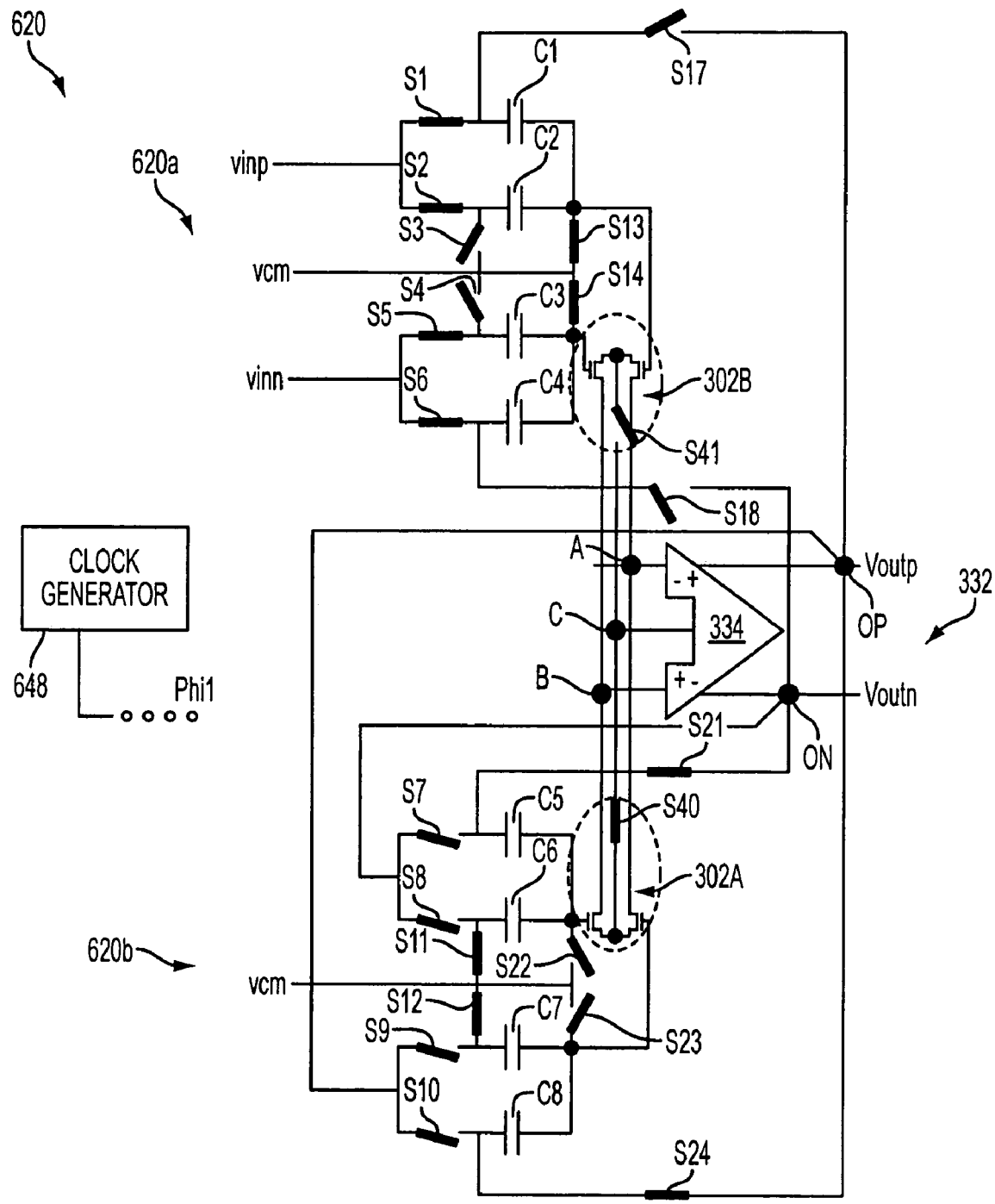
FIGS. 14e and 14f illustrate a circuit portion of two stages of a pipelined analog-to-digital converter which share an operational amplifier constructed in accordance with another embodiment.
Figure 14F:
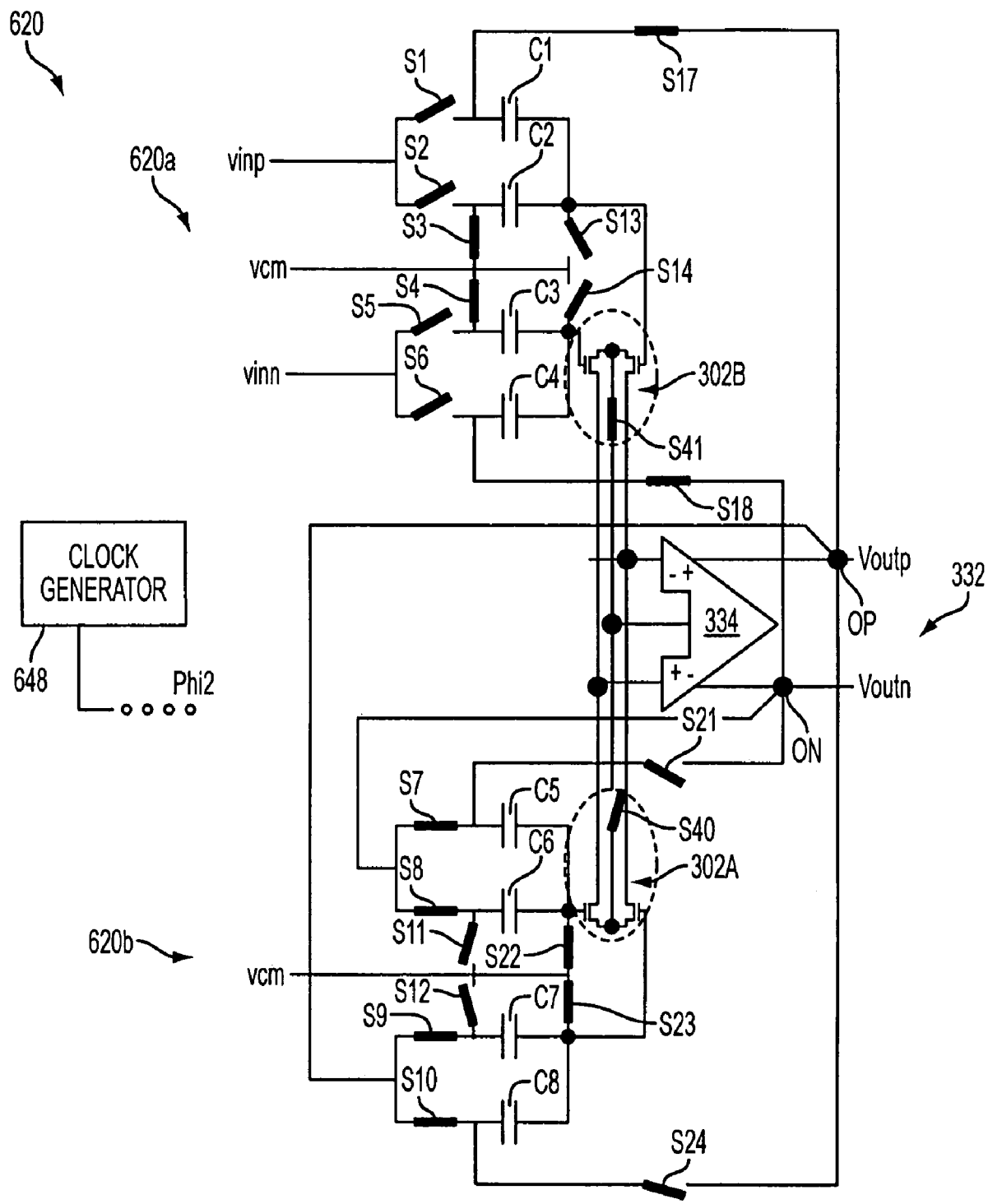

FIGS. 14e and 14f illustrate a circuit portion 620 of two stages 620$_a$, 620$_b$ of a pipelined analog-to-digital converter which share an operational amplifier 332 constructed in accordance with another embodiment. The first stage 620$_a$ comprises four capacitors C1, C2, C3, C4 and switches S1, S2, S3, S4, S5, S6, S13, S14, S17 and S18 and includes the second input circuit 302B of amplifier 332. The second stage 620$_b$ comprises four capacitors C5, C6, C7, C8 and switches S7, S8, S9, S10, S11, S12, S21, S22, S23, and S24 and includes the first input circuit 302A of amplifier 332. The connection between switches S9 and S10 is connected to output node OP while the connection between switches S7 and S8 is connected to output node ON. Between the two stages 620$_a$, 620$_b$, is the remaining circuitry 334 of the folded cascode operational amplifier 332 described above.

FIG. 14e illustrates the configuration for the two stages 620$_a$, 620$_b$ when the first clock signal PHI1 is generated and asserted by a clock generator 648. As with other embodiments, the generator 648 generates the first and second clock signals PHI1, PHI2 at the timing illustrated in FIG. 2. When the first clock signal PHI1 is asserted, switches S1, S2, S5, S6, S13 and S14 are closed in the first stage 620$_a$ while switches S11, S12, S21 and S24 are closed in the second stage 620$_b$. In addition, switch S40 is closed in the first input circuit 302A. This configuration connects the first stage 620$_a$ to receive the differential input signals Vinp, Vinn while the second stage 620$_b$ amplifies signals previously stored in capacitors C5, C6, C7 and C8. Vcm is a common mode voltage used to place charge on (or read charge out of) the capacitors C1-C8.

FIG. 14f illustrates the configuration for the two stages 620$_a$, 620$_b$ when the second clock signal PHI2 is generated and asserted by the clock generator 648. When the second clock signal PHI2 is asserted, switches S3, S4, S17 and S18 are closed in the first stage 620$_a$, switches S7, S8, S9, S10, S22 and S23 are closed in the second stage 620$_b$ and switch S41 is closed in the second input circuit 302B. This configuration connects the second stage 620$_b$ to receive differential input signals Vinp, Vinn while the first stage 620$_a$ amplifies signals previously stored in capacitors C1-C4. As can be seen, since the generator 648 generates the first and second clock signals PHI1, PHI2 at the timing illustrated in FIG. 2, the amplifier 332 and circuitry 620 achieve the same advantages as the other embodiments described above.

Figure 14G:
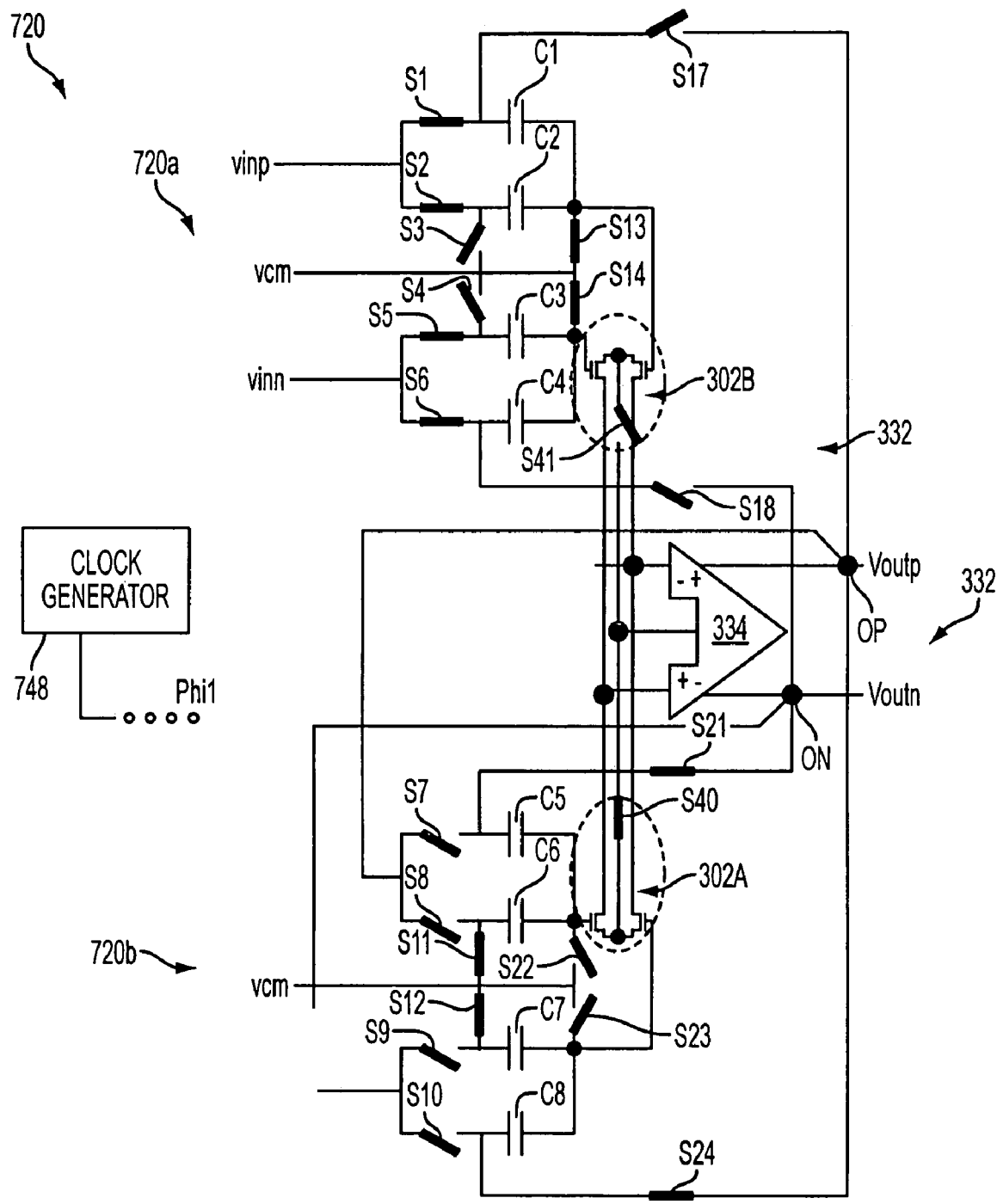
FIGS. 14g and 14h illustrate a circuit portion of two stages of a pipelined analog-to-digital converter which share an operational amplifier constructed in accordance with another embodiment.
Figure 14H:
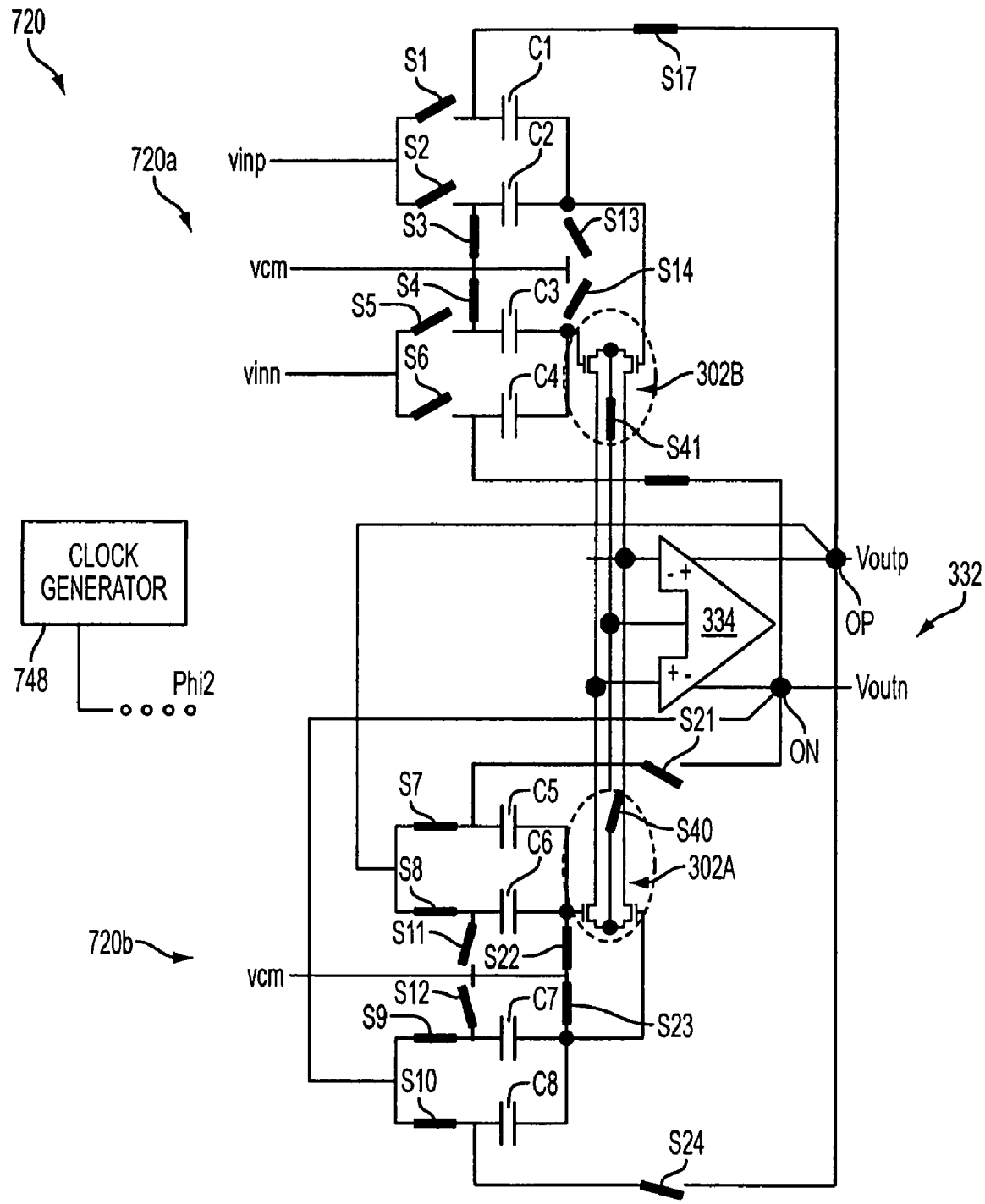

FIGS. 14g and 14h illustrate a circuit portion 720 of two stages 720$_a$, 720$_b$ of a pipelined analog-to-digital converter which share an operational amplifier 332 constructed in accordance with an embodiment. The first stage 720$_a$ comprises four capacitors C1, C2, C3, C4 and switches S1, S2, S3, S4, S5, S6, S13, S14, S17 and S18 and includes the second input circuit 302B of amplifier 332. The second stage 720$_b$ comprises four capacitors C5, C6, C7, C8 and switches S7, S8, S9, S10, SI1, S12, S21, S22, S23, and S24 and includes the first input circuit 302A of amplifier 332. In this embodiment, the connection between switches S9 and S10 is connected to output node ON while the connection between switches S7 and S8 is connected to output node OP. Between the two stages 720$_a$, 720$_b$, is the remaining circuitry 334 of the folded cascode operational amplifier 332 described above.

FIG. 14g illustrates the configuration for the two stages 720$_a$, 720$_b$ when the first clock signal PHI1 is generated and asserted by a clock generator 748. As with other embodiments, the generator 748 generates the first and second clock signals PHI1, PHI2 at the timing illustrated in FIG. 2. When the first clock signal PHI1 is asserted, switches S1, S2, S5, S6, S13 and S14 are closed in the first stage 720 while switches S11, S12, S21 and S24 are closed in the second stage 720$_b$. In addition, switch S40 is closed in the first input circuit 302A. This configuration connects the first stage 720$_a$ to receive the differential input signals Vinp, Vinn while the second stage 720$_b$ amplifies signals previously stored in capacitors C5, C6, C7 and C8. Vcm is a common mode voltage used to place charge on (or read charge out of) the capacitors C1-C8.

FIG. 14h illustrates the configuration for the two stages 720$_a$, 720$_b$ when the second clock signal PHI2 is generated and asserted by the clock generator 748. When the second clock signal PHI2 is asserted, switches S3, S4, S17 and S18 are closed in the first stage 720$_a$, switches S7, S8, S9, S10, S22 and S23 are closed in the second stage 720$_b$ and switch S41 is closed in the second input circuit 302B. This connects the second stage 720$_b$ to receive differential input signals Vinp, Vinn while the first stage 720$_a$ amplifies signals previously stored in capacitors C1-C4. As can be seen, since the generator 748 generates the first and second clock signals PHI1, PHI2 at the timing illustrated in FIG. 2, the amplifier 332 and circuitry 720 achieve the same advantages as the other embodiments described above.

Figure 15:
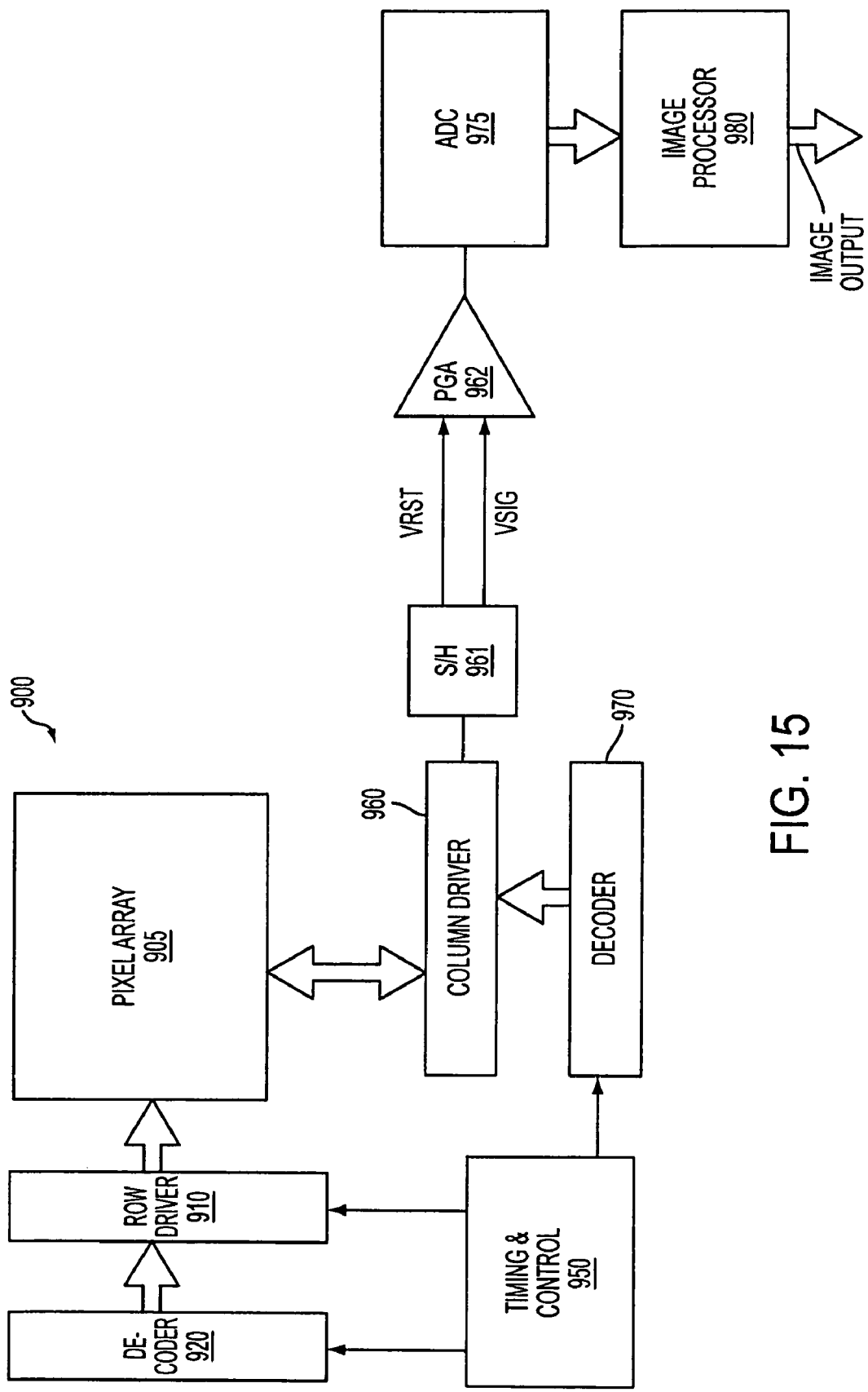
FIG. 15 is a block diagram of a CMOS imager, which utilizes either the pipelined analog-to-digital converter or the shared channel processing circuitry constructed in accordance with an example embodiment.

FIG. 15 illustrates an exemplary imager 900 that may utilize the analog-to-digital converter or shared channel processing circuitry constructed in accordance with any of the embodiments described above. The imager 900 has a pixel array 905 comprising rows and columns of pixels. Row lines are selectively activated by a row driver 910 in response to row address decoder 920. A column driver 960 and column address decoder 970 are also included in the imager 900. The imager 900 is operated by the timing and control circuit 950, which controls the address decoders 920, 970. The control circuit 950 also controls the row and column driver circuitry 910, 960.

A sample and hold circuit 961 associated with the column driver 960 reads a pixel reset signal Vrst and a pixel image signal Vsig for selected pixels. A differential signal (Vrst-Vsig) is amplified by differential programmable gain amplifier (PGA) 962 for each pixel and is digitized by the pipelined analog-to-digital converter 975. The analog-to-digital converter 975 supplies the digitized pixel signals to an image processor 980, which forms a digital image. Alternatively, the sample and hold circuit 961 and the analog-to-digital converter 975 may be connected in a shared two channel configuration such as the configuration illustrated in FIGS. 7c, 11a, 11b, 13a, 13b. Each channel would be responsible for a different set of pixel signals (e.g., one channel can process red and blue pixel signals, while the other channel processes green pixel signals).

Figure 16:
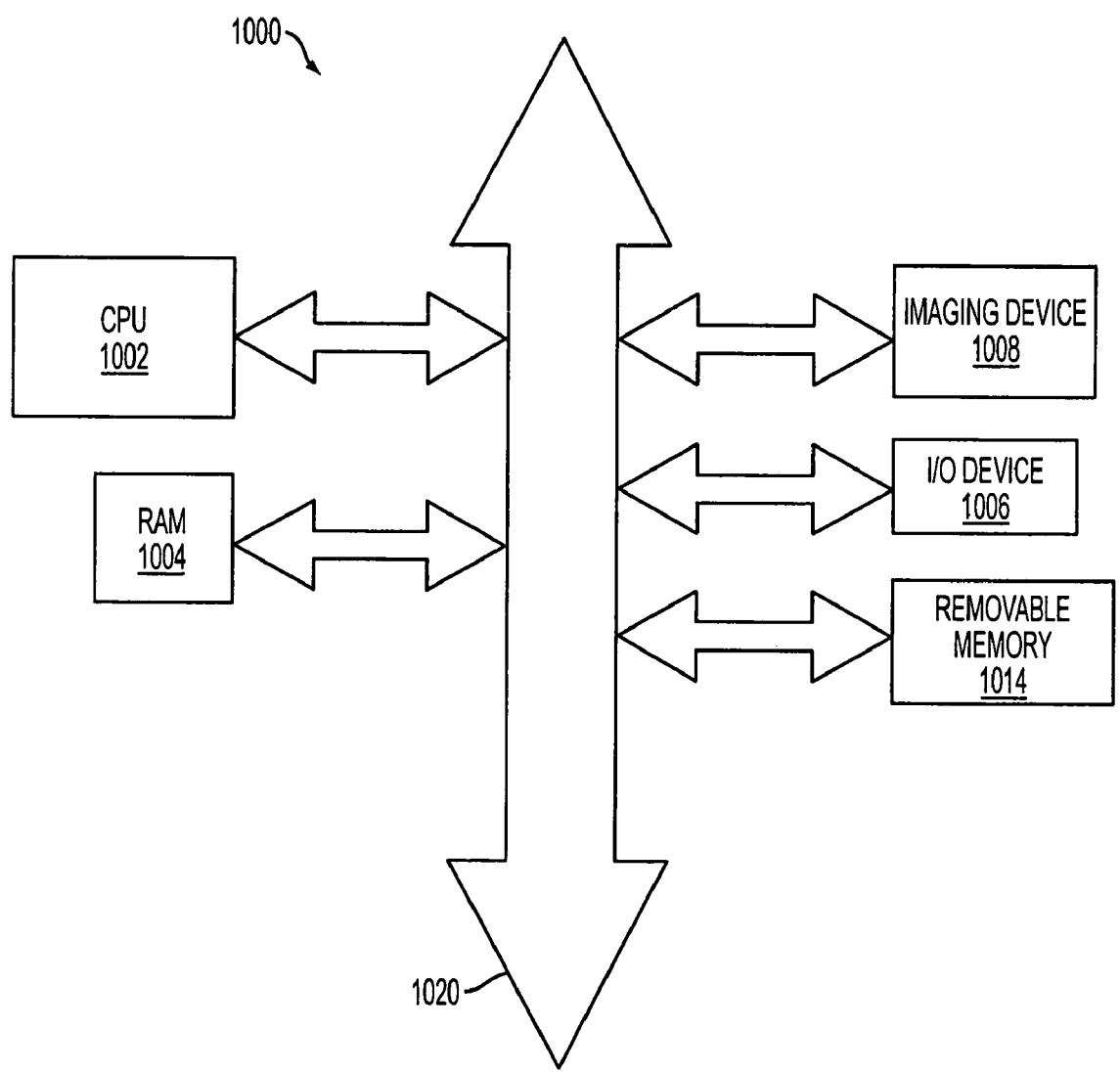
FIG. 16 is a block diagram of a processing system utilizing the imaging system illustrated in FIG. 15.

FIG. 16 shows a system 1000, a typical processor system modified to include an imaging device 1008 (such as the imaging device 900 illustrated in FIG. 15) implementing an embodiment described herein. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 1000, for example a camera system, generally comprises a central processing unit (CPU) 1002, such as a microprocessor, that communicates with an input/output (I/O) device 1006 over a bus 1020. Imaging device 1008 also communicates with the CPU 1002 over the bus 1020. The processor-based system 1000 also includes random access memory (RAM)1004, and can include removable memory 1014, such as flash memory, which also communicate with the CPU 1002 over the bus 1020. The imaging device 1008 may be combined with a processor, such as a CPU, digital signal processor, or microprocessor, with or without memory storage on a single integrated circuit or on a different chip than the processor.

The processes and devices described above illustrate preferred methods and typical devices of many that could be used and produced. The above description and drawings illustrate embodiments, which achieve the objects, features, and advantages described herein. However, it is not intended that these embodiments be strictly limited to the above-described and illustrated embodiments. It should be appreciated that modifications, though presently unforeseeable, of these embodiments that comes within the scope of the following claims can be made.

What is claimed as new and desired to be protected by Letters Patent of the United States is:

1. A pipelined analog-to-digital converter, comprising:
an amplifier comprising first and second input circuits;
first and second pipeline stages, the pipeline stages sharing the amplifier, the first pipeline stage being switchably connectable to the first input circuit and the second pipeline stage being switchably connectable to the second input circuit; and
a clock generator generating first and second clock signals and applying the first and second clock signals to the pipeline stages and amplifier,
wherein the first clock signal causes the first stage to perform a first operation and the second stage to perform a second operation, the first clock signal disconnecting the first pipeline stage from the first input circuit during the first operation and connecting the second pipeline stage to the second input circuit during the second operation, and
wherein parasitic capacitance is discharged from the first input circuit while the first clock signal is asserted by connecting an input node of the first input circuit to a voltage source.

2. The converter of claim 1, wherein the second clock signal causes the first stage to perform the second operation and the second stage to perform the first operation, the second clock signal connecting the first pipeline stage to the first input circuit during the second operation and disconnecting the second pipeline stage from the second input circuit during the first operation.

3. The converter of claim 2, wherein parasitic capacitance is discharged from the second input circuit while the second clock signal is asserted by connecting an input node of the second circuit to the voltage source.

4. The converter of claim 1, wherein the first operation is a sampling operation and the second operation is an amplifying operation.

5. The converter of claim 1, wherein the first and second input circuits each comprise two switches for connecting stored differential signals to first and second input nodes of the amplifier.

6. The converter of claim 1, wherein the first and second input circuits each comprise a switch for connecting stored differential signals to a biasing node of the amplifier.

7. The converter of claim 1, wherein the amplifier is configured as a folded cascode amplifier.

8. The converter of claim 1, further comprising:
a second amplifier comprising third and fourth input circuits; and
third and fourth pipeline stages, the third and fourth pipeline stages sharing the second amplifier, the third pipeline stage being switchably connectable to the third input circuit and the fourth pipeline stage being switchably connectable to the fourth input circuit;
wherein the clock generator applying the first and second clock signals to the third and fourth pipeline stages and second amplifier, and
wherein the first clock signal causes the third stage to perform the first operation and the fourth stage to perform the second operation, the first clock signal disconnecting the third pipeline stage from the third input circuit during the first operation and connecting the fourth pipeline stage to the fourth input circuit during the second operation.

9. The converter of claim 1, wherein the amplifier has a first node connected to first switches in each of the first and second input circuits and a second node connected to second switches in each of the first and second input circuits.

10. An imager comprising:
a pixel array;
sample and hold circuitry coupled to receive analog signals from pixels within the array;
an amplification circuit for amplifying the analog signals; and
a pipelined analog-to-digital converter connected to receive and convert the amplified analog signals to digital signals, the converter comprising:
an amplifier comprising first and second input circuits,
first and second pipeline stages, the pipeline stages sharing the amplifier, the first pipeline stage being switchably connectable to the first input circuit and the second pipeline stage being switchably connectable to the second input circuit, and
a clock generator generating first and second clock signals and applying the first and second clock signals to the pipeline stages and amplifier,
the first clock signal causes the first stage to perform a sampling operation and the second stage to perform an amplifying operation, the first pipeline stage being disconnected from the first input circuit while the second pipeline stage is connected to the second input circuit in response to the first clock signal, and the second pipeline stage being disconnected from the second input circuit while the first pipeline stage is connected to the first input circuit in response to the second clock signal, and
wherein parasitic capacitance is discharged from the first input circuit while the first clock signal is asserted by connecting an input node of the first input circuit to a voltage source.

11. The imager of claim 10, wherein the second clock signal causes the first stage to perform the amplifying operation and the second stage to perform the sampling operation, the first pipeline stage being connected to the first input circuit in response to the second clock signal during the amplifying operation and the second pipeline stage being disconnected from the second input circuit during the sampling operation in response to the second clock signal.

12. The imager of claim 11, wherein parasitic capacitance is discharged from the second input circuit while the second clock signal is asserted by connecting an input node of the second circuit to the voltage source.

13. The imager of claim 10, wherein the first and second input circuits each comprise two switches for connecting stored differential signals to first and second input nodes of the amplifier.

14. The imager of claim 10, wherein the first and second input circuits each comprise a switch for connecting stored differential signals to a biasing node of the amplifier.

15. The imager of claim 10, wherein the amplifier is configured as a folded cascode amplifier.

16. A camera system comprising:
a processor; and
an imager coupled to the processor, the imager comprising a pixel array, sample and hold circuitry coupled to receive analog signals from pixels within the array, an amplification circuit for amplifying the analog signals and a pipelined analog-to-digital converter connected to receive and convert the amplified analog signals to digital signals, the converter comprising:
an amplifier comprising first and second input circuits,
first and second pipeline stages, the pipeline stages sharing the amplifier, the first pipeline stage being switchably connectable to the first input circuit and the second pipeline stage being switchably connectable to the second input circuit, and a clock generator generating first and second clock signals and applying the first and second clock signals to the pipeline stages and amplifier, the first clock signal disconnecting the first pipeline stage from the first input circuit while connecting a node of the first input circuit to a discharge path during a first operation and connecting the second pipeline stage to the second input circuit during a second operation.

17. The system of claim 16, wherein the second clock signal connects the first pipeline stage to the first input circuit during the second operation and disconnects the second pipeline stage from the second input circuit during the first operation.

18. The system of claim 17, wherein the first operation is a sampling operation and the second operation is an amplifying operation.

19. The system of claim 17, wherein the first and second input circuits each comprise two switches for connecting stored differential signals to first and second input nodes of the amplifier.

20. The system of claim 17, wherein the first and second input circuits each comprise a switch for connecting stored differential signals to a biasing node of the amplifier.

21. The system of claim 17, wherein the amplifier is configured as a folded cascode amplifier.

22. The system of claim 17, wherein the analog-to-digital converter further comprises:

a second amplifier comprising third and fourth input circuits; and third and fourth pipeline stages, the third and fourth pipeline stages sharing the second amplifier, the third pipeline stage being switchably connectable to the third input circuit and the fourth pipeline stage being switchably connectable to the fourth input circuit;

wherein the clock generator applying the first and second clock signals to the third and fourth pipeline stages and second amplifier, and wherein the first clock signal causes the third stage to perform the first operation and the fourth stage to perform the second operation, the first clock signal disconnecting the third pipeline stage from the third input circuit during the first operation and connecting the fourth pipeline stage to the fourth input circuit during the second operation.

23. A method of operating a pipelined analog-to-digital converter comprising an amplifier having first and second input circuits, the converter having a first pipeline stage being switchably connectable to the first input circuit and a second pipeline stage being switchably connectable to the second input circuit, the method comprising the acts of:

performing a first operation in the first stage in accordance with a first clock signal; and performing a second operation in the second stage in accordance with the first clock signal, wherein parasitic capacitance is discharged from the first input circuit, while the first clock signal is asserted, by connecting an input node of the first input circuit to a voltage source.

24. The method of claim 23, further comprising the acts of:

performing the second operation in the first stage in accordance with a second clock signal; and performing the first operation in the second stage in accordance with the second clock signal.

25. The method of claim 24, wherein parasitic capacitance is discharged from the second input circuit while the second clock signal is asserted by connecting an input node of the second input circuit to the voltage source.

26. The method of claim 24, wherein the first operation is a sampling operation and the second operation is an amplifying operation.

* * * * *